United States Patent
Itoh et al.

[11] Patent Number: 5,809,409
[45] Date of Patent: Sep. 15, 1998

[54] BALANCED MIXER, DISTRIBUTER AND BAND REJECTION FILTER FOR USE IN SAME, AND FREQUENCY MIXING METHOD

[75] Inventors: Kenji Itoh; Tomonori Sigematsu; Akio Iida, all of Kamakura, Japan

[73] Assignee: Mitsubishi Denki Kabushiki Kaisha, Tokyo, Japan

[21] Appl. No.: 330,427

[22] Filed: Oct. 27, 1994

[30] Foreign Application Priority Data

Mar. 12, 1993 [JP] Japan ................................. 5-052108

[51] Int. Cl.[6] ................................ H04B 1/16; H01P 3/08; H03D 7/18
[52] U.S. Cl. ........................... 455/327; 455/317; 455/330; 333/128; 333/204
[58] Field of Search .................................. 455/317, 326, 455/327, 330, 333; 333/110, 116, 117, 125, 128, 136, 204, 202

[56] References Cited

U.S. PATENT DOCUMENTS

| | | | |
|---|---|---|---|
| 4,799,034 | 1/1989 | Silverman et al. | 333/204 |
| 4,896,374 | 1/1990 | Waugh et al. | 455/327 |
| 5,179,728 | 1/1993 | Sowadski | 455/183.1 |

FOREIGN PATENT DOCUMENTS

| | | | |
|---|---|---|---|
| 55-21673 | 2/1980 | Japan | 455/317 |
| 63-157503 | 6/1988 | Japan | 333/128 |
| 2-151107 | 6/1990 | Japan . | |
| 5-335803 | 12/1993 | Japan | 333/204 |

OTHER PUBLICATIONS

Stephen A. Mass "Microwave Mixers" 1986 pp. 281–312.

*Primary Examiner*—Chi H. Pham
*Attorney, Agent, or Firm*—Wolf, Greenfield & Sacks, P.C.

[57] ABSTRACT

In order to further suppress unwanted waves which may occur when the frequency (flo) of a local oscillation wave is lower than the frequency (fin) of a signal wave, the local oscillation wave is in-phase distributed between unit mixers (2a) and (2b) whereas the signal wave is opposite-phase distributed through a 180 degree distributer (4) to the unit mixers (2a) and (2b). The unit mixers (2a) and (2b) execute frequency mixing of thus distributed local oscillation wave and signal wave, and supply the result through a BRF (16a) or (16b) into a 180 degree combiner (6). The 180 degree combiner (6) effects an opposite-phase combination of outputs of the BRFs (16a) and (16b), and outputs the result. Among the unwanted waves, harmonics of the local oscillation wave are suppressed by the opposite-phase combination, the signal wave is suppressed by virtue of the BRFs (16a) and (16b), and a mixed wave of the harmonics of the local oscillation wave and harmonics of the signal wave is suppressed by the in-phase distribution of the local oscillation wave and the opposite-phase distribution of the signal wave.

31 Claims, 18 Drawing Sheets

BALANCED MIXER, DISTRIBUTER AND BAND REJECTION FILTER FOR USE IN SAME, AND FREQUENCY MIXING METHOD

TECHNICAL FIELD

The present invention relates to a balanced mixer applicable to, e.g., a repeater for satellite communication systems, and in particular, to a reduction of unwanted wave components contained in its output waves. The present invention is further directed to a distributer and band rejection filter both constituting the balanced mixer, and to a frequency mixing method capable of being realized by use of the balanced mixer.

BACKGROUND ART

Shown in FIG. 20 is a configuration of a conventional balanced mixer as disclosed in, for instance, "Microwave Mixers", S. A. Mass, Artech house, 1986, pp. 281–312.

The balanced mixer depicted in this diagram comprises unit mixers $2a$ and $2b$. Signal waves having a frequency fin are supplied via a signal wave input terminal 1 into both the unit mixers $2a$ and $2b$. A signal wave input into the unit mixer $2a$ at that time is equivalent in amplitude and phase to a signal wave input into the unit mixer $2b$. Besides the signal waves received through the signal wave input terminals 1, the unit mixers $2a$ and $2b$ further receive local oscillation waves having a frequency flo by way of a local oscillation wave input terminal 3 and a 180 degree distributer 4. On that occasion, the 180 degree distributer 4 phase-shifts the phase of a local oscillation wave input into the unit mixer $2b$ by $\pi$ radian (180 degrees) with respect to the phase of a local oscillation wave input into the unit mixer $2a$. Consequently, the phase of the local oscillation wave input into the unit mixer $2a$ is opposite to that of the local oscillation wave input into the unit mixer $2b$. Besides, the amplitude of the local oscillation wave fed into the unit mixer $2a$ is the same as that of the local oscillation wave fed into the unit mixer $2b$.

The unit mixers $2a$ and $2b$ each include semiconductor elements such as diodes or transistors, and a matching circuit for matching the same to a transmission line. By utilizing the nonlinearity of this semiconductor, the unit mixers $2a$ and $2b$ execute frequency mixing of the input signal waves and local oscillation waves. The unit mixers $2a$ and $2b$ each provide a wave derived from the frequency mixing into a 180 degree combiner 6. The 180 degree combiner 6 phase-shifts the phase of the output wave of the unit mixer $2b$ by $\pi$ radian, and then combines the output wave of the unit mixer $2a$ with the output wave of the unit mixer $2b$. A wave derived from the combination is output from an output terminal 5.

When actually configuring the balanced mixer shown in FIG. 20, use is made of a configuration as depicted in, e.g., FIG. 21. Referring to this diagram, the unit mixer $2a$ consists of an FET (field-effect transistor) $9a$, an input matching circuit $12a$ and an output matching circuit $13a$. The FET $9a$ is fitted with a grounded source s, a gate g which receives signal waves and local oscillation waves by way of the input matching circuit $12a$, and a drain d from which frequency mixed waves are output by way of the output matching circuit $13a$. Similarly, the unit mixer $2b$ is composed of an FET $9b$, an input matching circuit $12b$ and an output matching circuit $13b$. The FET $9b$ is equipped with a grounded source s, a gate g which receives signal waves and local oscillation waves through the input matching circuit $12b$, and a drain d from which mixed waves are output through the output matching circuit $13b$. The input matching circuits $12a$ and $12b$ are circuits for matching the gate-source impedance of the FET $9a$ or $9b$ with a 180 degree hybrid $7a$, whereas the output matching circuit $13a$ and $13b$ are circuits for matching the drain-source impedance of the FET $9a$ or $9b$ with a 180 degree hybrid $7b$.

The 180 degree hybrid $7a$ corresponds roughly to the 180 degree distributer 4 in the configuration of FIG. 20. The 180 degree hybrid $7a$ feeds signal waves input through the signal wave input terminal 1 into both of the input matching circuits $12a$ and $12b$. The 180 degree hybrid $7a$ is so configured as not to cause any phase difference between a signal wave fed into the input matching circuit $12a$ and a signal wave fed into the input matching circuit $12b$. Also, the 180 degree hybrid $7a$ provides local oscillation waves input through a local oscillation wave input terminal 3 into both of the input matching circuits $12a$ and $12b$. The 180 degree hybrid $7a$ is so configured as to phase-shift a local oscillation wave fed into the input matching circuit $12b$ by $\pi$ radian with respect to a local oscillation wave fed into the input matching circuit $12a$. Accordingly, each gate of the FETS $9a$ and $9b$ receives a combined wave constituted of a signal wave and a local oscillation wave, the local oscillation wave associated with the wave received by the gate g of the FET $9b$ is phase-shifted by $\pi$ radian with respect to the local oscillation wave associated with the wave received by the gate g of the FETs $9a$. The gates g of the FETs $9a$ and $9b$ are voltage driven by local oscillation waves applied thereto, thereby turning on/off the FETs $9a$ and $9b$. These actions allow the signal waves applied to the gates g to be frequency mixed with the local oscillation waves, resulting in mixed waves being applied to the drains d of the FETs $9a$ and $9b$.

These mixed waves are fed via the output matching circuit $13a$ or $13b$ into the 180 degree hybrid $7b$. The 180 degree hybrid $7b$ corresponds to the 180 degree combiner 6 in the configuration of FIG. 20. The 180 degree hybrid $7b$ phase-shifts a mixed wave fed through the output matching circuit $13b$ by $\pi$ radian with respect to a mixed wave fed through the output matching circuit $13a$, and then combines the mixed wave input through the output matching circuit $13a$ with the mixed wave input through the output matching circuit $13b$, to finally output an output wave obtained by the combination through the output terminal 5. Although the 180 degree hybrid $7b$ also has a function to combine the input of two different waves which are in-phase, the output terminal associated with this function is grounded in FIG. 21.

A typical configuration of the 180 degree hybrids $7a$ and $7b$ is a rat-race type. A rat-race type 180 degree hybrid includes four ports in total arranged on a circular transmission line having a full length of $3⁄2$ wavelength so as to be separated by a space of a quarter wavelength from one another. When inputting a wave through any port, an output will appear on the port spaced an odd multiple of a quarter wavelength away from this port, with no output appearing on the port spaced an even multiple of a quarter wavelength away therefrom. The phase difference between outputs appearing on the different two ports from the wave fed into the same port depends on the transmission lengths of the respective output ports relative to the input port. Accordingly, in the case of using the rat-race type 180 degree hybrid as the 180 degree hybrid 7, the respective ports are used as depicted in FIG. 22.

More specifically, of two ports adjoining (that is, spaced by a quarter wavelength from) the port for use as the signal wave input terminal 1, one is used for the connection with the unit mixer 2a, and the other for the connection with the unit mixer 2b. Then, used as the local oscillation wave input terminal 3 is a port having a difference of a half wavelength between the length of the transmission line up to the port used for the connection with the unit mixer 2a, and the length of the transmission line up to the port used for the connection with the unit mixer 2b. As a result, the four ports are used, in clockwise sequence, as the local oscillation wave input terminal 3, the connection port with the unit mixer 2b, the signal wave input terminal 1, and the connection port with the unit mixer 2a. In the diagram, each of reference numerals 14a to 14c denote a transmission line having a length of a quarter wavelength, and 15 denotes a transmission line having a length of three-quarter wavelength.

Thus, the length of the transmission line 14a from the signal wave input terminal 1 up to the unit mixer 2a becomes equal to the length of the transmission line 14b up to the unit mixer 2b therefrom, which are both a quarter wavelength, with the result that the signal wave fed into the unit mixer 2a from the signal wave input terminal 1 through the rat-race type 180 is in-phase with the signal wave fed into the unit mixer 2b. Since the difference is a half wavelength between the lengths of the transmission lines 14a, 14b and 14c from the local oscillation wave input terminal 3 up to the unit mixer 2a, and the length of the transmission line 14a up to the unit mixer 2b therefrom, the signal wave fed into the unit mixer 2a from the local oscillation wave input terminal 3 through the rat-race type 180 degree hybrid is opposite in phase to the signal wave fed into the unit mixer 2b.

In the case of using the rat-race type 180 degree hybrid depicted in FIG. 22 as the 180 degree hybrid 7b, the four ports are used, in clockwise sequence, as the connection port with the unit mixer 2b, the output terminal 5, the connection port with the unit mixer 2a, and the grounded port.

2b so as to be in-phase with each other. Even if these signal waves pass through the unit mixers 2a and 2b into the 180 degree combiner 6 or the 180 degree hybrid 7b, the output of the signal wave from the output terminal 5 will be suppressed because the phase difference therebetween is 0 radian. On the contrary, considering local oscillation waves input through the local oscillation input terminal 3, these local oscillation waves are distributed between the unit mixers 2a and 2b so as to be opposite in phase to each other. If these local oscillation waves pass through the unit mixers 2a and 2b into the 180 degree combiner 6 or the 180 degree hybrid 7b, the output of the local oscillation wave from the output terminal 5 will be emphasized. In the case of an application where the frequency of the local oscillation wave is significantly lower than that of the mixed wave, there will arise no problem even if the local oscillation wave has been "output" from the output terminal 5, since it can be removed at the subsequent stage. Further considering mixed waves which are respective results of the frequency mixing in the unit mixers 2a and 2b, the output of the mixed waves from the output terminal 5 will be emphasized since the phase difference of these mixed waves is π radian.

This relationship applies to the unwanted waves contained in the local oscillation waves or the mixed waves. For instance, considering an unwanted wave having a frequency n·flo (n: any integer) which is a harmonic of the local oscillation wave, this unwanted wave travels along the same signal path as that of the local oscillation wave within the balanced mixer, into the 180 degree combiner 6 or the 180 degree hybrid 7b. This unwanted wave possesses a frequency n times the frequency of the local oscillation wave. Hence, the phase difference between the unwanted wave input from the unit mixer 2a into the 180 degree combiner 6 or the 180 degree hybrid 7b and the unwanted wave input from the unit mixer 2b into the 180 degree combiner 6 or the 180 degree hybrid 7b is n times the phase difference between

TABLE 1

|  | SIGNAL WAVE fin | LOCAL OSCILLATION flo | MIXED WAVE fin ± flo | UNWANTED WAVE \|mfin ± nflo\| | UNWANTED WAVE nflo |
|---|---|---|---|---|---|
| MIXER 2a | ○ | ○ | ○ | ○ | ○ |
| MIXER 2b | ○ | π | π | nπ | nπ |
| OUTPUT TERMINAL | SUPPRESS | OUTPUT | OUTPUT | SUPPRESS (n:EVEN) OUTPUT (n:ODD) | |

Table 1 above represents the content of output waves which may emerge from the output terminal 5 of the balanced mixer having the configuration depicted in FIG. 20 or 21. According to the configuration as shown in FIG. 20 or 21, the output wave of the unit mixer 2a and the output wave of the unit mixer 2b are combined by means of the 180 degree combiner 6 or the 180 degree hybrid 7b. Since, upon the combination, the output wave of the unit mixer 2b is phase-shifted by π radian with respect to the output wave of the unit mixer 2a, among signal components constituting the output wave of the unit mixer 2b and signal components constituting the output wave of the unit mixer 2a, pairs having a phase difference of 0 radian will cancel out without any resultant output, whereas pairs having a phase difference of π radian will cooperate for emphasis with each other with a resultant output. In Table 1, offset pairs and emphatically cooperating pairs are represented as "suppress" and "output", respectively. Considering, e.g., signal waves input through the signal wave input terminal 1, for example, these signal waves are distributed between the unit mixers 2a and the local oscillation wave input from the unit mixer 2a into the 180 degree combiner 6 or the 180 degree hybrid 7b and the local oscillation wave input from the unit mixer 2b into the 180 degree combiner 6 or the 180 degree hybrid 7b. Since the phase difference between the local oscillation waves is π radian as described above, the phase difference between the unwanted waves will result in n π radian. Therefore, the harmonics n·flo of the local oscillation wave is "suppressed" when n is even, but "output" when n is odd.

Other types of unwanted waves can include a mixed wave of a harmonic of the local oscillation wave and harmonic of the signal wave. This type of unwanted wave may be produced in the respective unit mixers 2a and 2b. The frequency of this unwanted wave can be expressed as |m·fin±n·flo| (m, n: any integer). Comparing the phase of this type of unwanted wave input from the unit mixer 2a into the 180 degree combiner 6 or the 180 degree hybrid 7b with the phase of this type of unwanted wave input from the unit mixer 2b into the 180 degree combiner 6 or the 180 degree hybrid 7b, it will be understood that the section "n·flo"

brings about the same phase difference n π radian as that of other type of unwanted wave previously described. In consequence, the mixed wave |m·fin±n·flo| of the harmonics of the local oscillation wave and the harmonics of the signal wave will be "suppressed" when n is even, but "output" when n is odd.

In this manner, the use of the balanced mixer having a configuration shown in FIG. 20 or 21 will, in principle, enable the unwanted wave to be suppressed when n is even.

However, the unwanted waves may actually be output irrespective of m being even. Further, this unwanted wave may possibly present a nonnegligible level and possess a frequency extremely close to the frequency of the mixed wave to the extent that can not be removed by filtering.

A repeater for Ku-band satellite communication will now be considered as a concrete example. This type of repeater will require a mixer capable of obtaining an output wave whose frequency is 12.5 GHz when inputting a signal wave whose frequency fin is 14 GHz. To this end, it is necessary to use, as a local oscillation wave, a wave whose frequency flo is 14 GHz–12.5 GHz=1.5 GHz. In the case of using, as a local oscillation wave, a wave having a lower frequency than the frequencies of the signal wave and the output wave in this manner, at a frequency extremely close to the frequency fout of the output wave an unwanted wave appears having a relatively higher level, in other words, a harmonic of the local oscillation wave or a mixed wave of the harmonic of the signal wave and the harmonic of the local oscillation wave. As is apparent from FIG. 23, for example, a relatively high level is conferred on the unwanted waves appearing at the frequency 8flo (=10 GHz) or at the frequency |2fin–10flo| (=13 GHz). It is generally impossible to remove by filters such unwanted waves which appear at such close proximity frequencies in this manner.

A cause of occurrence of such unwanted waves lies in the phase accuracy of the 180 degree distribution and the 180 degree combination to be executed before and behind the unit mixers 2a and 2b.

In the balanced mixer having a configuration depicted in FIG. 20 or FIG. 21, input signal waves and local oscillation waves are distributed through the 180 degree distributer 4 or the 180 degree hybrid 7a to the unit mixers 2a and 2b. On that occasion, the 180 degree distributer 4 or the 180 degree hybrid 7a confers a phase difference of π radian onto the local oscillation waves to be distributed to the respective mixers 2a and 2b. The 180 degree combiner 6 or the 180 degree hybrid 7b combines a wave output from the unit mixer 2a with a wave output from the unit mixer 2b. At that time, the 180 degree combiner 6 or the 180 degree hybrid 7b confers a phase difference of π radian relative to the wave output from the unit mixer 2a, onto the wave output from the unit mixer 2b. In the configuration depicted in FIG. 20 or FIG. 21, such 180 degree distribution and 180 degree combination are utilized to implement the "output" and "suppression" of the waves. Accordingly, if the phase accuracy for the 180 degree distribution and 180 degree combination is poor, or involves an error, then unwanted waves may be output irrespective of n being even. In order to increase the suppression amount of the unwanted waves, it is required to execute the 180 degree distribution and 180 degree combination at a higher phase accuracy.

A case will be considered, by way of example, where the rat-race type 180 degree hybrid shown in FIG. 22 is used as the 180 degree distributer 4 or 180 degree hybrid 7a. In this case, the in-phase distribution of the signal waves from the signal wave input terminal 1 into the unit mixers 2a and 2b is effected by setting the lengths of the transmission lines 14b and 14c at a quarter of the wavelength to be used. Even though the signal wave input terminal 1 receives a frequency slightly different from the frequency envisaged upon the design, there arises no difference between the phase-shift amount by the transmission line 14b and the phase-shift amount by the transmission line 14c due to the equivalent length of the transmission lines 14b and 14c. In other words, the in-phase distribution of the signal waves from the signal wave input terminal 1 into the unit mixers 2a and 2b can be effected at a relatively high accuracy by merely setting the lengths of the transmission lines 14b and 14c to be equal.

On the contrary, it is difficult to effect at such a high accuracy an opposite-phase distribution of the local oscillation waves from the local oscillation wave input terminal 3 into the unit mixers 2a and 2b. This is because of the fact that it is necessary to set the lengths of the transmission lines 14a and 15 to be a quarter and three-quarters, respectively, of the wavelength used and to set the difference in length of the two lines to be a quarter wavelength. In other words, only the extremely narrow frequency band in which a half of the wavelength of the input local oscillation wave advantageously equals the difference in length between the transmission lines 14a and 15 is permitted to undergo a satisfactory accuracy on the opposite-phase distribution of the local oscillation waves from the local oscillation input terminal 3 into the unit mixers 2a and 2b. Thus, in view of the band width necessary for the practical use, the accuracy on the opposite-phase distribution will inevitably be lower.

Based on this fact, let $\epsilon$ be an opposite-phase distribution phase error caused by the 180 degree distributer 4 or the 180 degree hybrid 7a. The in-phase distribution error is neglected. This assumption will lead to a transformation of Table 1 into Table 2. That is, in Table 1 is π substituted by π+ϵ.

TABLE 2

|  | SIGNAL WAVE fin | LOCAL OSCILLATION flo | MIXED WAVE fin ± flo | UNWANTED WAVE \|mfin ± nflo\| | UNWANTED WAVE nflo |
|---|---|---|---|---|---|
| MIXER 2a | ○ | ○ | ○ | ○ | ○ |
| MIXER 2b | ○ | π + ϵ | π + ϵ | nπ + nϵ | nπ + nϵ |
| OUTPUT TERMINAL | SUPPRESS | OUTPUT | OUTPUT | SUPRESSION αdB (n:EVEN) OUTPUT (n:ODD) |  |

When such a phase error occurs, the suppression level α[dB] of the unwanted waves is given by the following expression $$\alpha = -10 \log \left[ \frac{1 - \cos(n\epsilon)}{1 + \cos(n\epsilon)} \right] \quad (1)$$

As is apparent from this expression, the higher the order of n is, the more prominent the influence ε of the error becomes. Taking as an example an unwanted waves having a frequency |2fin−10flo| among the unwanted waves depicted in FIG. 23., the suppression level of this unwanted wave can be as represented in FIG. 24. As is seen from the figure, if the opposite-phase distribution phase error caused by the 180 degree distributer 4 or 180 degree hybrid 7a increases up to the order of 9 degrees (π/20 radian), the employment of the balanced mixer will present virtually no effect of suppressing the unwanted waves.

In this manner, the balanced mixer having the conventional configuration has hitherto involved a problem that the suppression level of the unwanted waves appearing in the vicinity of a desired output wave frequency is small, due particularly to a lower phase accuracy on the opposite-phase distribution by the 180 degree distributer. For this reason, it has been desired, as one of the functions of the balanced mixer, to suppress these types of unwanted wave that cannot be removed by filtering, in the application having a relatively lower frequency flo of the local oscillation wave, among the applications requiring a frequency conversion by use of a mixer within a repeater due to different input/output frequencies, as in the case of the repeater for use in, for example, radio communication systems with a microwave band, in particular, satellite communication systems.

DISCLOSURE OF THE INVENTION

The present invention was conceived to overcome the above deficiencies, and an object of the present invention is to provide a balanced mixer capable of increasing the amount of unwanted waves that are suppressed. The present invention aims, in particular, at suppressing unwanted wave having a relatively higher level which may occur at a frequency in the vicinity of that of an output wave obtained by frequency mixing. Another object of the present invention is to suppress unwanted waves which may be caused by mixing an m-degree harmonic of a signal wave and an n-degree harmonic of a local oscillation wave. The present invention aims at suppressing unwanted waves where m is even. The invention also aims at suppressing unwanted waves where m is a low number. A further object of the present invention is to suppress unwanted waves being n-degree harmonics of the local oscillation wave. A still further object of the present invention is to reduce the necessary phase accuracy of a distributer by suppressing unwanted waves. The present invention aims at accomplishing the above objects by the use of a simple circuit configuration.

In order to achieve such objects, a balanced mixer of the present invention comprises a plurality of unit mixers each for frequency mixing a supplied signal wave and a local oscillation wave having a predetermined frequency to produce a mixed wave; a distribution means which receives signal waves having a predetermined frequency and effects respective different phase changes on the signal waves to be distributed among different unit mixers and then distributively supplies the signal waves to the plurality of unit mixers; a plurality of signal wave rejection means each provided corresponding to the plurality of unit mixers for removing a signal wave from a mixed wave produced by the unit mixer associated therewith; and a combination means for phase-shifting and then combining a plurality of mixed waves from which of signal waves are removed by the signal wave rejection means, in response to the phase changes effected by the distribution means. In the present invention, signal waves are distributed with mutual phase differences among the plurality of unit mixers. If the number of the unit mixers is two, for example, then the distribution means distributes signal waves to the two unit mixers in such a manner that the mutual phase difference is π radian (opposite-phase distribution of signal waves). As a result of this, each unit mixer can receive an in-phase distribution of the local oscillation wave. Each unit mixer executes frequency mixing of the signal wave and the local oscillation wave to produce a mixed wave. The thus obtained mixed wave is filtered by the signal wave rejection means. The mixed waves after filtration, subjected to phase-shift in response to the phase change effected by the distribution means, are combined by the combination means.

Accordingly, the execution of frequency mixing of the distributed signal wave and the local oscillation wave by each unit mixer will result in the mixer output including, besides the target mixed wave, a signal wave which has leaked from the unit mixer, n-degree harmonic of the local oscillation wave, or a mixed wave of the n-degree harmonic of the local oscillation wave and m-degree harmonic of the signal wave. Among the waves included in the output of each unit mixer, the signal wave which has leaked from the unit mixer is rejected by the signal wave rejection means before reaching the combination means, and hence is not permitted to appear in the output of the combination means. Also, due to the in-phase distribution of the local oscillation waves to respective unit mixers, the n-degree harmonics of the local oscillation waves to be output from respective unit mixers will be in-phase with one another and suppressed when combining the mixed waves in the combination means. Moreover, the mixed wave of the n-degree harmonics of the local oscillation wave and the m-degree harmonics of the signal wave can be suppressed when m is even, although it appears as the output of the combination means when m is odd.

If the distribution means causes a phase error at the time of opposite-phase distribution, the phase error will appear on a signal wave input into each unit mixer. The distributor usually used as a distribution means in this technical field has a good accuracy, and is used for in-phase distribution in the present invention, which means that the local oscillation wave input into the unit mixer suffers from hardly any phase error unlike the prior art. Due to the in-phase distribution of the local oscillation wave, no influence of the phase error will be exerted on the n-degree harmonics of the local oscillation wave, among the waves output from the unit mixer. In the case where a phase error is contained in the signal wave distributed to each unit mixer, the phase error will affect the signal wave which has leaked from the unit mixer, or the mixed wave of the n-degree harmonics of the local oscillation wave and the m-degree harmonics of the signal wave, among the waves output from the unit mixer.

Among these waves, the signal wave which has leaked from the unit mixer, since it is rejected by the signal rejection means, can be appropriately suppressed in the output of the combination means. On the contrary, the mixed wave of the n-degree harmonics of the local oscillation wave and the m-degree harmonics of the signal wave, when m is even, suffers from a phase error m times the phase error caused by the distributer, which will restrict the level suppression of that wave. However, problematic among the mixed waves of the n-degree harmonics of the local oscillation wave and the m-degree harmonics of the signal wave is a wave having a frequency in the vicinity of the frequency of the target mixed wave, that is, of the mixed wave of the signal wave and the local oscillation wave, and having a relatively higher level. Providing that the frequency of the local oscillation wave is lower than that of the signal wave, m of the wave having such a frequency will lead to a relatively small value such as 0 or 2. For this reason, even though a phase error m times the phase error has appeared on the mixed wave of the n-degree harmonics of the local oscillation wave and the m-degree harmonics of the signal wave among the waves output from the unit mixer, the value of this phase error is a relatively small one with the result that the suppression level will be increased.

In this manner, the present invention will ensure an effective suppression of unwanted waves such as the signal wave which leaks from the unit mixer, n-degree harmonics of the local oscillation wave, and the mixed wave of the m-degree harmonics of the signal wave and the n-degree harmonics of the local oscillation wave, by means of the band rejection filtration of the unit mixer output, in-phase distribution of the local oscillation wave, and so on. This will result in a balanced mixer allowing the suppression level of the unwanted to be increased. In particular, it is possible to suppress an unwanted wave having a relatively higher level which may appear at the frequency in the vicinity of that of the mixed wave to be output. This will contribute to a relaxation of the demand for the phase accuracy of the distributer used as a distribution means.

Such function and effect can be accomplished by a simple circuit configuration. The distribution means in particular, of the balanced mixer configured in accordance with the present invention, includes a means for inputting signal waves; an opposite-phase distribution means for providing input signal waves with respective different phases to distributively supply to the different unit mixers; a means for inputting local oscillation waves; and an in-phase distribution means for distributing input local oscillation waves in phase among all the unit mixers.

Such a configuration of the distribution means will enable a source-grounded field-effect transistor to be employed as a semiconductor element which constitutes the unit mixer and is used for the frequency mixing. This field-effect transistor receives signal waves and local oscillation waves through the gate. The gate is then driven by the local oscillation wave, resulting in a frequency conversion of the signal wave to permit the mixed wave to be output from the drain. Thus, the unit mixer can be implemented by a simple configuration using a source-grounded field-effect transistor.

The same function and effect can be also implemented by the following configuration. More specifically, the distribution means, in particular, of the balanced mixer configured in accordance with the present invention, includes a means for inputting signal waves; and an opposite-phase distribution means for providing input signal waves with respective different phases to distributively supply to the different unit mixers. The combination means includes a means for inputting mixed waves from the plurality of unit mixers; an opposite-phase combination means for providing a plurality of input mixed waves with respective phases corresponding to the different phases conferred by the distribution means and then combining them for the output as an output wave; a means for the input of local oscillation signals; and an in-phase distribution means for distributing input local oscillation waves in phase among all the unit mixers.

Such a configuration of the distribution means and the combination means will also enable a source-grounded field-effect transistor to be employed as a semiconductor element which constitutes the unit mixer and is used for the frequency mixing. This field-effect transistor receives signal waves through its gate, and the local oscillation wave through its drain. The drain is then driven by the local oscillation wave, resulting in a frequency conversion of the signal wave to permit the mixed wave to be output from the drain. Thus, the unit mixer can be implemented by a simple configuration using a source-grounded field-effect transistor.

It is to be appreciated that the semiconductor element constituting the unit mixer and used for frequency mixing can be elements other than the above-described field-effect transistor. In other words, it has only to possess a nonlinear characteristic necessary for the frequency mixing of the signal wave and the local oscillation wave. In the case where impedance matching between the semiconductor element and the distribution means, and between the semiconductor element and the combination means is problematic, there can be provided an input matching circuit for impedance matching the connection of the semiconductor element and the distribution means, and an output matching circuit for impedance matching the connection of the semiconductor element and the combination means. The distribution means and the combination means having such functions can be implemented by a 180 degree hybrid such as a rat-race.

The function and effect of the suppression of unwanted waves in the present invention can be further improved by the provision of the unwanted wave suppression means. More specifically, the balanced mixer configured in accordance with the present invention further comprises an unwanted wave suppression means interposed between the output terminals of the unit mixers for suppressing unwanted waves having a frequency which lies in the vicinity of an even multiple of the frequency of a signal wave. This will ensure a further suppression of the unwanted waves such as the mixed wave of the m-degree harmonics of the signal wave and n-degree harmonics of the local oscillation wave.

The unwanted wave suppression means, in particular, of the balance mixer configured in accordance with the present invention includes a transmission line which is interposed between the output terminals of the unit mixers and whose electrical length at the frequency of a mixed wave is equal to approx. one half wavelength, whereby the unwanted wave having a frequency in the vicinity of an even multiple of the frequency of the signal wave is suppressed by reflection toward the unit mixer side. In this configuration, the transmission line connecting the output terminals of respective unit serves as a quarter-wave open stub with respect to the unwanted wave having a frequency in the vicinity of an even multiple of the frequency of the signal wave, thus allowing this unwanted wave to be reflected toward the unit mixer side. The employment of this configuration will contribute to the increase in the suppression amount of the unwanted waves by a simple circuit configuration.

The unwanted wave suppression means, in particular, of the balanced mixer configured in accordance with the present invention alternatively includes a first transmission line which is interposed between the output terminals of the two unit mixers and whose electrical length at the frequency of a mixed wave is equal to approx. one half wavelength; a couple of terminating impedances interposed between the first transmission line and the output terminals of the two unit mixers; a couple of second transmission lines which are interposed between the output terminals of the two unit mixers and the signal wave rejection means and whose electrical length at the frequency of a mixed wave is equal to approx. one quarter wavelength; and a third transmission line which is interposed between the two second transmission lines on the side of the signal wave rejection means and whose electrical length at the frequency of a mixed wave approximates to one half wavelength, whereby the unwanted wave having a frequency in the vicinity of an even multiple of the frequency of the signal wave is suppressed by the termination. In this configuration, for the unwanted wave having a frequency in the vicinity of an even multiple of the frequency of the signal wave, the first and third transmission lines act as a quarter-wave open stub while the second transmission line acts as a quarter-wave short stub, with the result that this unwanted wave is terminated by the terminating impedance. Accordingly, the employment of this configuration will ensure a prevention of the occurrence of a multiple reflection due to the reflection of this unwanted wave toward the unit mixer side, and a further increase in the suppression amount of the unwanted wave.

The distribution means, in particular, of the balanced mixer configured in accordance with the present invention can be comprised of the distributer of the present invention. The distributer of the present invention includes a first transmission line through which an input signal wave is transmitted; a second transmission line coupled with the first transmission line through a first coupling portion provided at its one end, so as to allow the transmission of a signal wave supplied through the first coupling portion from the first transmission line; and a third transmission line coupled with the first transmission line through the first coupling portion provided at its one end, so as to allow the transmission, opposite in phase to that of the second transmission line, of a signal wave supplied through the first coupling portion from the first transmission line whereby the signal waves, with a mutual phase difference of $\pi$ radian, are distributed to the two unit mixers.

The use of the distributer thus configured will enable an improvement in the phase accuracy at the time of opposite-phase distribution. In other words, the opposite distribution in this configuration is implemented based on the coupling of the first transmission line and the second and third transmission lines, but never implemented based on the difference in line length of a plurality of transmission lines, with the result that it is difficult in principle to bring about any phase error. Therefore, the use of the distributer having such a configuration as a distribution means in the balanced mixer of the present invention will ensure an increase in the suppression amount of the mixed wave of the m-degree harmonics of the signal wave and the n-degree harmonics of the local oscillation wave, among the unwanted waves. This distributer may be used in place of the conventional distributer in the conventional balanced mixer, which will also ensure the function and effect of suppressing the unwanted waves.

The distributer configured in accordance with the present invention further includes a fourth transmission line which connects the opposite end to the one end at which the first coupling portion is defined of the second transmission line, and the opposite end to the one end at which the first coupling portion is defined of the third transmission line, the fourth transmission line having approx. one half wavelength at the frequency of a signal wave; and a couple of terminating impedances intervening between the connection of the fourth transmission line and the second transmission line, and the connection of the fourth transmission line and the third transmission line; the second and third transmission lines having, at the frequency of a signal wave, approx. one half wavelength.

By virtue of such a configuration, the fourth transmission line serves as a quarter-wave open stub when the second and third transmission lines are subjected to the in-phase excitation, and the one ends, on the output side, of the second and third transmission lines are terminated by the terminating impedance, with the result that a satisfactory isolation is established between the output side one end of the second transmission line and the output side one end of the third transmission line. This will contribute to a further increase in the suppression amount of the unwanted waves.

The distributer of the present invention can be implemented by a slot line or microstrip line. For example, in the case where the first transmission line is comprised of a slot line whose one end is open and where the second and third transmission lines are comprised of microstrip lines, the coupling of the first transmission line and the second and third transmission lines can be implemented as a magnetic coupling of the slot line and the microstrip lines.

Further, in the case of providing a fifth transmission line coupled with the first transmission line at the second coupling portion located at its one end, so as to allow the supply of the signal wave through the second coupling portion into the first transmission line, the impedance conversion at the first and second coupling portions will ensure an impedance matching between the fifth transmission line and the first transmission line, and between the first transmission line and the second and third transmission lines. This fifth transmission line can be also comprised of a microstrip line. In that case, the second coupling portion is implemented by a magnetic coupling of the slot line and the microstrip lines.

The signal wave rejection means, in particular, of the balanced mixer in accordance with the present invention can be implemented by a plurality of signal wave component rejection filters of the present invention. The signal wave component rejection filters are provided so as to correspond to the plurality of unit mixers, to remove signal waves from the mixed waves produced by the respective associated unit mixers.

The signal wave component rejection filter of the present invention includes a coupling line whose electrical length is approximately one half wavelength at the frequency of a signal wave supplied through the unit mixer associated therewith; a terminating line having an electrical length in the order of one half wavelength at the frequency of a signal wave, the terminating line including one end connected to one end, on the associated unit mixer side, of the coupling line and including the other end connected to ground; and a terminating impedance connecting the one end, on the associated unit mixer side, of the coupling line and the terminating line.

Such a configuration will allow, at the frequency of the signal wave, the coupling line to act as an open circuit impedance, and the terminating line to act as a short circuit impedance, whereby the signal wave from the unit mixer is terminated by the terminating impedance. As a result of this, the signal waves are suppressed without reflection, and a balanced mixer presenting an increased suppression amount of the unwanted waves can be obtained.

The present invention may be represented as a method. The frequency mixing method of the present invention comprises the steps of distributing signal waves with different phases among a plurality of unit mixers; distributing local oscillation waves which are in-phase to all of the plurality of unit mixers; effecting frequency mixing, by use of the plurality of unit mixers, of the thus distributed signal waves and the thus distributed local oscillation signals, to produce a plurality of mixed waves; removing signal waves from the plurality of mixed waves; and phase-shifting the plurality of mixed waves cleared of the signal waves, in response to phases at the time of the distribution of the signal waves, to thereafter combine them for the production of an output wave.

A frequency mixing method according to the present invention further comprises the step of, prior to the removal of signal waves from a plurality of mixed waves after producing the plurality of mixed waves, suppressing, at the output side of each unit mixer, an unwanted wave having a frequency which is in the vicinity of an even multiple of the frequency of a signal wave.

In the frequency mixing method of the present invention, the unwanted waves are suppressed by the reflection or termination of the unwanted wave at the output side of each unit mixer.

In the frequency mixing method of the present invention, signal waves are distributed among the plurality of unit mixers by way of magnetic coupling of a plurality of transmission lines. The frequency mixing method of the present invention is characterized in that the magnetic coupling is coupling of a slot line and a plurality of microstrip lines. Preferably, between the outputs of the plurality of microstrip lines, isolation is established at the frequencies of signal waves.

In the frequency mixing method of the present invention, signal waves are terminated and removed from the plurality of mixed waves, with the aid of a transmission line and an impedance provided on one end, on the unit mixer side, of a coupling line whose rejection band covers frequencies of the signal waves.

Figure 1:
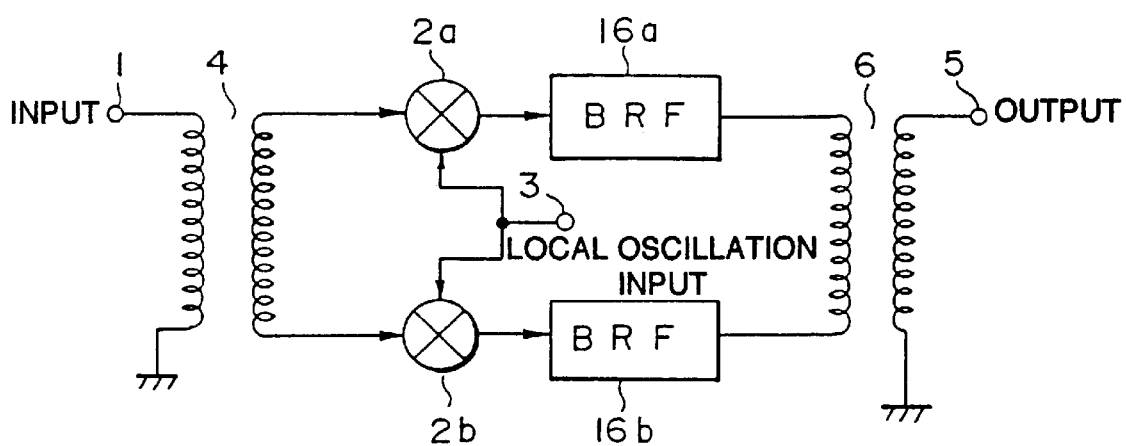
FIG. 1 is a block diagram showing a configuration of a balanced mixer in accordance with a first embodiment of the present invention.

In the figures, reference numeral 1 denotes a signal input terminal, 2a and 2b a unit mixer, 3 a local oscillation wave input terminal, 4 a 180 degree hybrid, 5 an output terminal, 6 a 180 degree combiner, 7a and 7b a 180 degree hybrid, 9a and 9b an FET, 12a and 12b an input matching circuit, 13a and 13b an output matching circuits and 16a and 16b denote a band rejection filter (BRF).

Reference numerals 17a and 17b represent output terminals for the unit mixers 2a and 2b, respectively, 18 a transmission line, and 19 represents a center of the transmission line 18.

Reference numerals 20 signifies an unwanted wave suppression circuit, 21a and 21b a resistor, 22, 23, 26a and 26b a transmission line, and 24 and 25 signify centers of the transmission lines 22 and 23.

Reference numerals 27 designates an input terminal, 29 a slot line, 29, 29a and 29b an open end of the slot lines 29, 30a, 30b, 31 and 38 a microstrip line, 32a and 32b a resistor, 33a and 33b an output terminal, 34 an arrow indicating a direction of a current flow, 35a and 35b a coupling point, 36 a center of the transmission line 31, and 37 designates a through-hole.

Reference numerals 29a and 39b indicate a terminal of a coupling line 40, 40 a coupling line, 41 a resistor, and 42 indicates a transmission line.

Variants fin and $\lambda$in represent a frequency and wavelength, respectively, of an input wave, flo a frequency of a local oscillation wave, fout and $\lambda$out a frequency and wavelength, respectively, of an output wave, $\epsilon$ a phase error at the time of opposite-phase distribution in the 180 degree distributer, m a degree of harmonics of the input wave, n a degree of harmonics of the local oscillation wave, $\beta$ a suppression amount of an unwanted wave with even m, $\lambda$h a wavelength of an unwanted wave, Z0 a characteristic impedance, and S21, S31 and S33 represent characteristics of the 180 degree distributer.

BEST MODE FOR CARRYING OUT THE INVENTION

A best mode for carrying out the invention will now be described based on a plurality of preferred embodiments and with reference to the accompanying drawings. Among reference numerals used for the explanation of the conventional configurations shown in FIGS. 20 to 24, those serving the simplification of the following description will be used as they are. It is, however, to be appreciated that constituent elements of the respective embodiments are not completely coincident in configuration with those referenced by the same numerals in the conventional examples. Also, the elements common to the respective embodiments are designated by the same reference numerals, and therefore the repeated description thereof will be omitted.

(1) 1st Embodiment

Referring to FIG. 1, there is depicted a configuration of a balanced mixer arranged in accordance with a first embodiment of the present invention. This embodiment includes a signal wave input terminal 1 and a local oscillation wave input terminal 3 which are positioned oppositely from those of the conventional example shown in FIG. 20. Accordingly, a signal wave supplied by way of the signal wave input terminal 1 is opposite-phase (or 180 degrees) distributed to unit mixers 2a and 2b, whereas a local oscillation wave supplied via the local oscillation wave input terminal 3 is in-phase distributed to the unit mixers 2a and 2b. Mixed waves output from the unit mixers 2a and 2b are input through band rejection filters (hereinafter referred to as BRF) 16a and 16b, respectively, into a 180 degree combiner 6. The 180 degree combiner 6 serves to subject the two waves to an opposite-phase combination, and provides the resultant output wave via an output terminal 5 into the subsequent circuit.

Thus, the positional change between the signal wave input terminal 1 and the local oscillation wave input terminal 3 will result in a "suppression" of the local oscillation wave, unlike the conventional example, of the waves input into the 180 degree combiner 6, and (if the presence of the BRFs 16a and 16b is temporarily ignored) the signal wave and the mixed wave will be exclusively "output" from the output terminal 5. Further, due to the in-phase distribution of the local oscillation wave, harmonics n·flo of the local oscillation wave, among unwanted waves, will be also "suppressed". For the same reason, a mixed wave |m·fin+n·flo| of harmonics of the signal wave and of the harmonics of the local oscillation wave, among the unwanted waves, is in principle "suppressed" when m is even, but "output" when m is odd. It does not depend on n. These are summed up in Table 3 below.

This embodiment is also characterized by the provision of the BRFs 16a an 16b. The BRF 16a is interposed between the unit mixer 2a and the 180 degree combiner 6, while the BRF 16b intervenes between the unit mixer 2b and the 180 degree combiner 6. The aim in providing these BRF 16a and 16b is to suppress input waves. More specifically, a mere positional change between the signal wave input terminal 1 and the local oscillation wave input terminal 3 would inconveniently result in the "output" of the signal wave as depicted in Table 3. In the first embodiment, this signal wave is suppressed by the BRFs 16a and 16b provided immediately behind the unit mixers 2a and 2b, respectively.

Represented by $\epsilon$ in Table 3 is a 180 degree distribution phase error by the 180 degree distributer 4. The suppression $\beta$ [dB] of an unwanted wave |m·fin+n·flo| in this embodiment can be given as expression (2) below.

$$\beta = -10 \log \left[ \frac{1 - \cos(m\epsilon)}{1 + \cos(m\epsilon)} \right] \quad (2)$$

Figure 2:
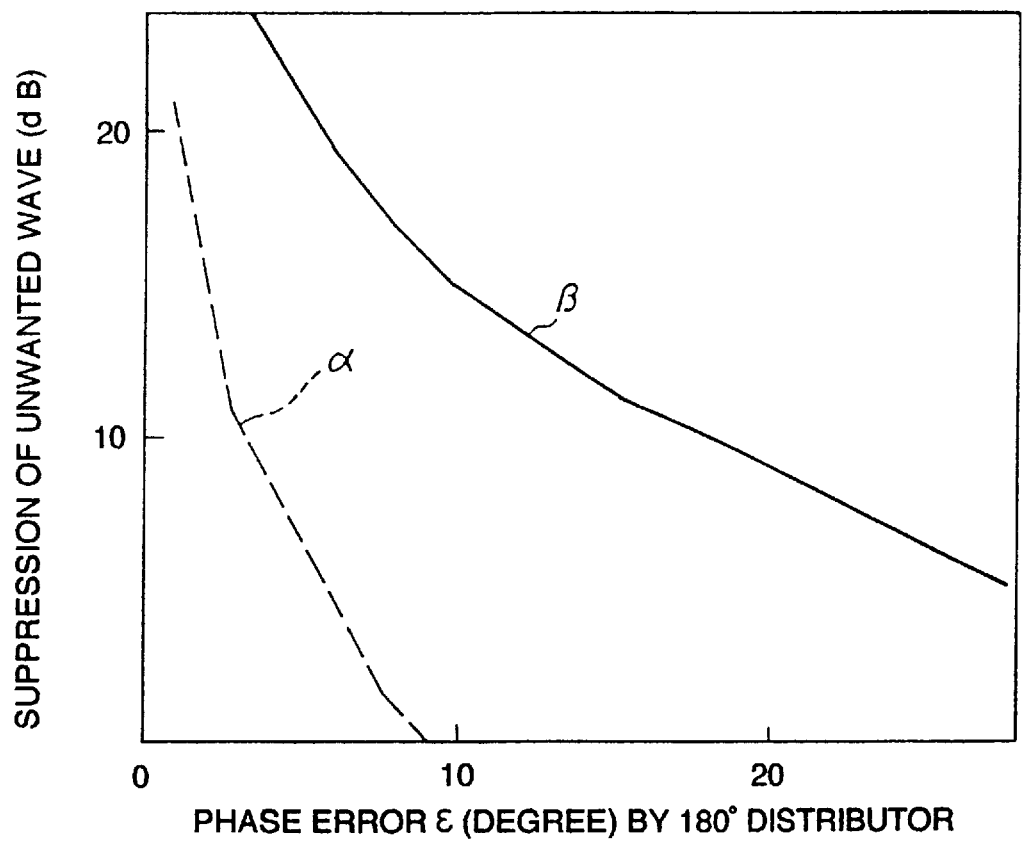
FIG. 2 illustrates a relationship between the amount of an unwanted wave suppressed by the balance mixer of FIG. 1 and phase errors.
Figure 23:
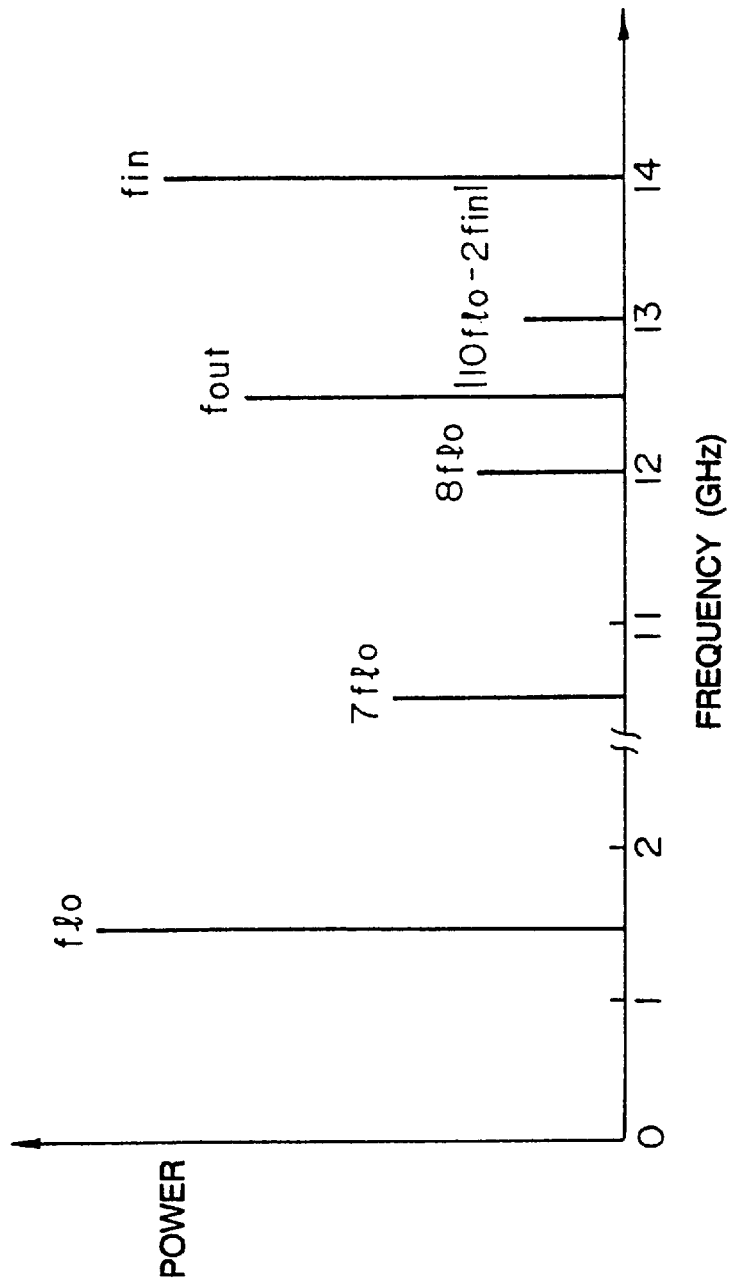
FIG. 23 is a frequency spectrum diagram for the explanation of unwanted waves output from a balanced mixer in a conventional repeater for Ku-band satellite communication.
Figure 24:
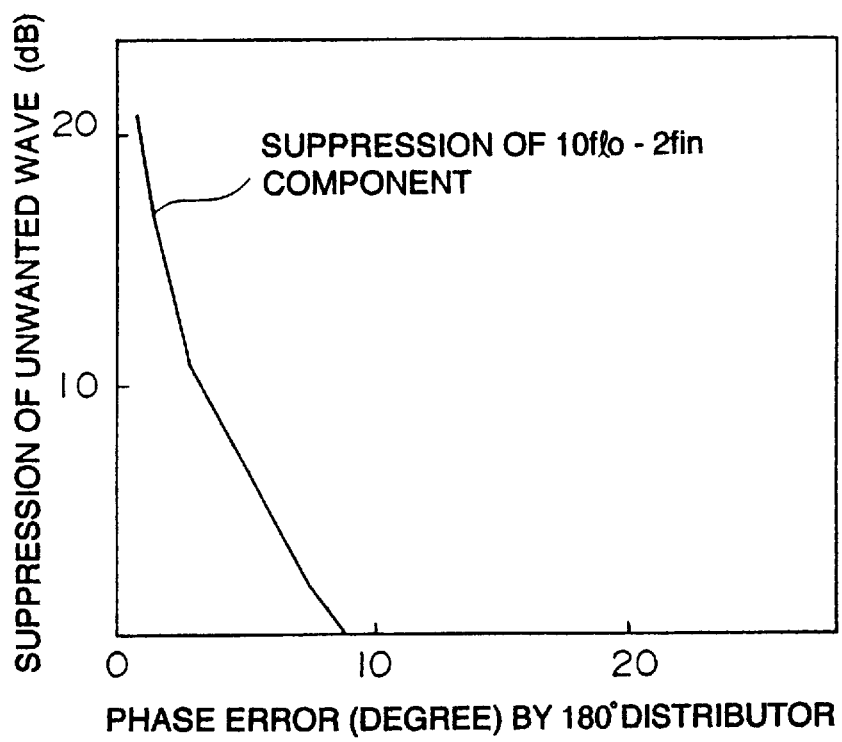
FIG. 24 is a diagram showing a relationship between the amount of an unwanted wave suppressed by the balanced mixer of FIG. 21 and phase errors.

Similar to the expression (1) in which the higher the order of n is, the more prominent the influence of the error $\epsilon$ becomes, the expression (2) also means that the influence of the error $\epsilon$ becomes more conspicuous as the order of m is higher. It is, however, to be noted that the unwanted waves which have presented any inconveniences in, e.g., FIG. 23 are always ones having a lower order of m. For example, m=0 for the unwanted wave having a frequency of 8flo, whereas m=2 for the unwanted wave having a frequency of 2fin-10flo. To take, for instance, the case of the latter unwanted wave with a frequency of 2fin-10flo, a suppression amount of as much as 15 dB can be obtained, as is apparent from FIG. 2, irrespective of the fact that the magnitude of the 180 degree distribution phase error $\epsilon$ is of the order of 9 degrees.

This discussion applies to other case, as well as the balanced mixer for use in the repeater for the Ku-band satellite communication. The problematic unwanted wave in the balanced mixer is generally a high-order harmonic (m=0) of the local oscillation wave or a mixed wave of the second harmonic wave (m=2) of the signal wave and of a harmonic of the local oscillation wave. Thus, use of the configuration of this embodiment will lead to the increase in the suppression amount $\beta$ of unwanted waves appearing in the vicinity of a desired output wave frequency fout, regardless of a low phase accuracy in the opposite-phase distribution by the 180 degree distributer 4. Accordingly, this embodiment will enable the appropriate suppression of such types of unwanted waves at are incapable of being removed by a filter in the application having a relatively low local oscillation wave frequency flo, among the applications requiring a frequency conversion by use of a mixer within the interior of the repeater due to different input and output frequencies, as in the case of the repeater for use in, e.g., microwave-band radio communication systems, and in particular, satellite communication systems.

TABLE 3

| | SIGNAL WAVE fin | LOCAL OSCILLATION flo | MIXED WAVE fin ± flo | UNWANTED WAVE \|mfin ± nflo\| | UNWANTED WAVE nflo |
|---|---|---|---|---|---|
| MIXER 2a | ○ | ○ | ○ | ○ | ○ |
| MIXER 2b | π + $\epsilon$ | ○ | π + $\epsilon$ | mπ + m$\epsilon$ | ○ |
| OUTPUT TERMINAL | OUTPUT | SUPPRESS | OUTPUT | SUPPRESSION $\beta$(dB) (m:EVEN) OUTPUT (m:ODD) | SUPPRESS |

More concrete examples of the thus configured embodiment will be described below. Naturally, this embodiment may be otherwise concretized.

(1.a) Concrete Example 1

Figure 3:
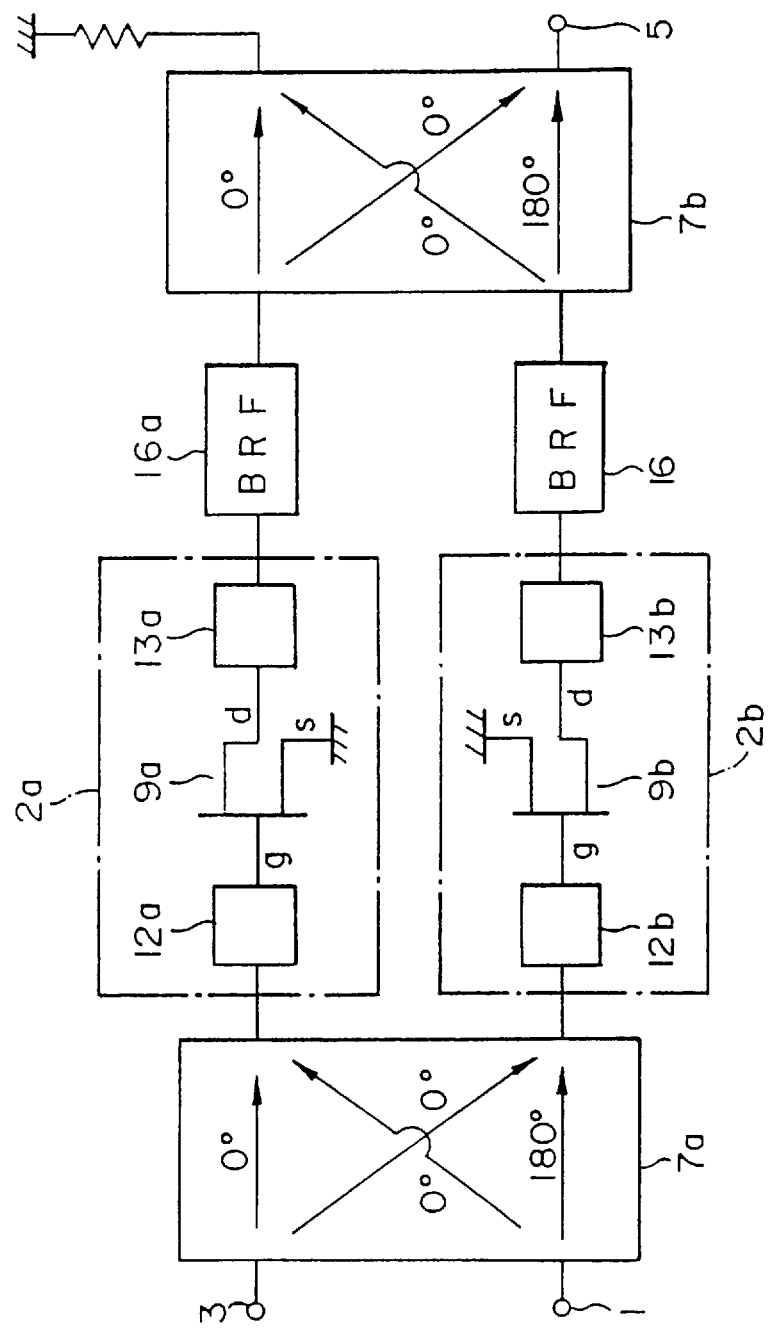
FIG. 3 illustrates one concrete example of the balanced mixer of FIG. 1.

FIG. 3 depicts a concrete example of the first embodiment. This concrete example is a variant of the conventional example shown in FIG. 21, in which a signal wave input terminal 1 and a local oscillation input terminal 3 are positionally changed with each other, and BRFs 16a and 16b are disposed immediately behind unit mixers 2a or 2b, respectively. Gates g of FETs 9a and 9b are voltage driven by a local oscillation wave so as to perform frequency mixing with a signal wave to be applied to the gates g. The resultant mixed waves are output from the drain d, and then supplied via the BRFs 16a and 16b into a 180 degree hybrid 7b. The 180 degree hybrid 7b executes a opposite-phase combination of the input mixed waves, and provides the thus obtained wave as an output wave.

(1.b) Concrete Example 2

Figure 4:
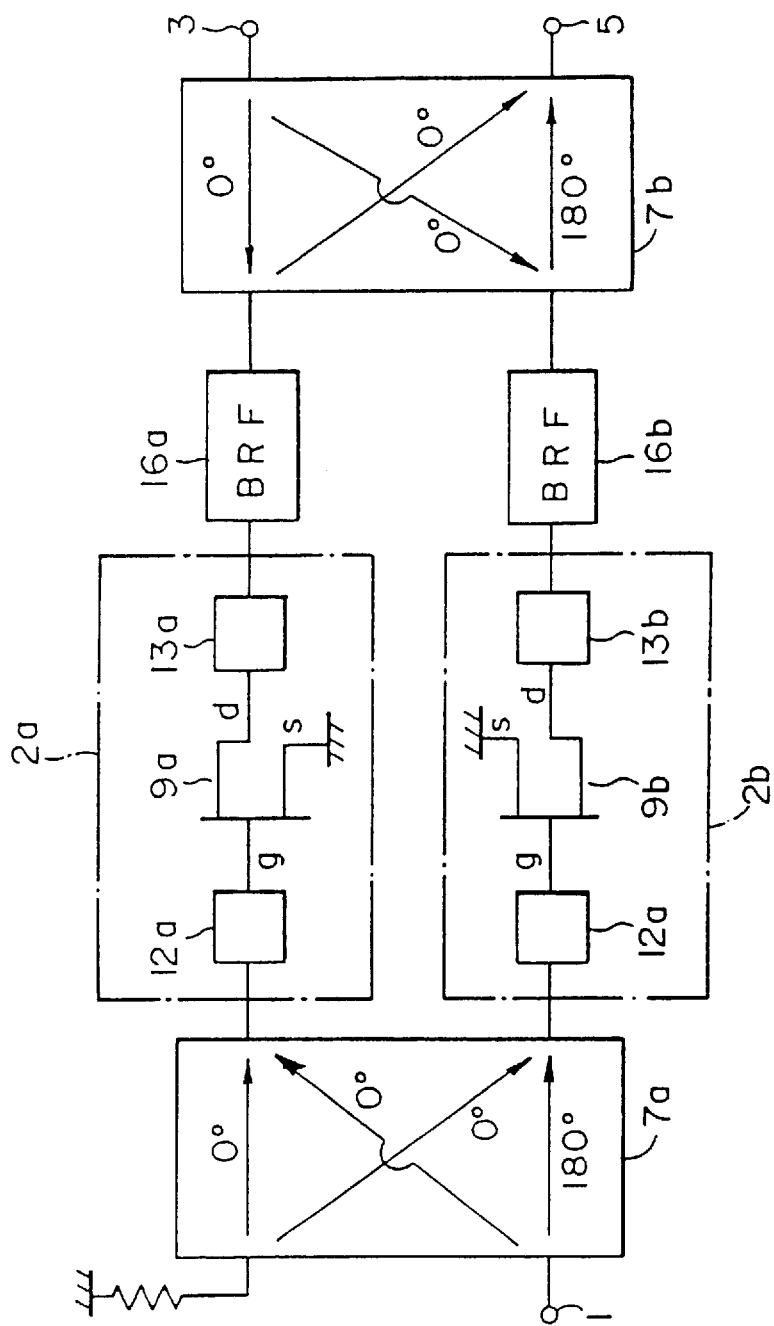
FIG. 4 illustrates another concrete example of the balanced mixer of FIG. 1.

FIG. 4 depicts another concrete examples of the first embodiment. In this concrete example, four ports of a 180 degree hybrid 7a serve as, respectively, a signal wave input terminal 1, a ground port, a port for connecting a unit mixer 2a, and a port for connecting a unit mixer 2b. A signal wave input through the signal wave input terminal 1, in the same manner as the FIG. 3 concrete example, is in-phase distributed to the unit mixers 2a and 2b. On the other hand, four ports of a 180 degree hybrid 7b function as, respectively, a local oscillation wave input terminal 3, an output terminal 5, a port for the connection of a BRF 16a, and a port for the connection of a BRF 16b. A local oscillation wave input through the local oscillation wave input terminal 3 is opposite-phase distributed via the BRF 16a or 16b to the unit mixers 2a and 2b, respectively. The thus distributed local oscillation waves drive of the FETs 9a and 9b. This will result in a frequency mixing of the signal wave being applied to the gate g, and the local oscillation wave being applied to the drain d, the thus obtained mixed wave being provided through the BRF 16a or 16b into the 180 degree hybrid 7b. The 180 degree hybrid 6b subjects the input mixed waves to an opposite-phase combination for the output through the output terminal 5.

2a and an output terminal 17b of a unit mixer 2b. The other configurations are substantially the same as those of the first embodiment. This diagram does not include the circuit configuration subsequent to BRFs 16a and 16b, for simplification.

The phase of a mixed wave emerging from the output terminal 17a of the unit mixer 2a is opposite to the phase of a mixed wave emerging from the output terminal 17 of the unit mixer 2b. Consequently, a center 19 of the transmission line 18 is effectively short-circuited to ground at the frequency of the mixed waves. Let the wavelength of the mixed wave be $\lambda \text{out} = c/\text{fout}$ (c: transmission velocity of an electromagnetic wave on the transmission line 18), then the line length extending from the output terminal 17a to the center 19 of the line 18 is $\lambda \text{out}/4$. Accordingly, if it is viewed from the output terminal 17a, the impedance of the center 19 being grounded will present an open circuit impedance at the mixed wave frequency. The same relationship applies to the impedance of the center 19 viewed from the output terminal 17b.

The phase of an unwanted wave having a frequency $|m \cdot \text{fin} \pm n \cdot \text{flo}|$, among unwanted waves originating from the output terminals 17a of the unit mixer 2a, when m is even, is in-phase with the phase of an unwanted wave having the same frequency originating from the output terminal 17b of the unit mixer 2b. Therefore, the center 19 of the transmission line 18 is in a substantially open circuit state at this frequency. Let the wavelength of this unwanted wave be $\lambda h = c/|m \cdot \text{fin} \pm n \cdot \text{flo}|$, then the line length extending from the output terminal 17a to the center 19 of the transmission line 18 is of the order of $m \cdot \lambda h/4$, that is, substantially an integral multiple of the half-wavelength of $\lambda h$. Accordingly, with impedance of the center being equivalent to an open circuit, when viewed from the output terminal 17a, it will be an open circuit impedance with respect to the unwanted wave of a frequency $|m \cdot \text{fin} + n \cdot \text{flo}|$. The same relationship applies to the impedance of the center 19 viewed from the output terminal 17b.

These relationships are summed up in Table 4 below.

TABLE 4

| | PHASE DIFFERENCE AT TERMINALS 17a AND 17b | IMPEDANCE AT CENTER 19 | IMPEDANCE OF CENTER 19 OBSERBED FROM TERMINAL 17a OR 17b |
|---|---|---|---|
| m = UNWANTED WAVE OF EVEN MIXED WAVE | O | OPEN | SHORT |
| | π | SHORT | OPEN |

(1.c) Others

Although the FETs are used as semiconductors for frequency mixing in the above description, they may be substituted by diodes or other kinds of transistors for the same effects. Also, rat-race type hybrids are, by way of example, employed as the 180 degree combiner 4 and the 180 degree distributer 6, but they may be substituted by a slot line branch or a magic T to obtain the same effects. The application is not intended to be limited to the repeater for Ku-band satellite communication.

(2) 2nd Embodiment

Figure 5:
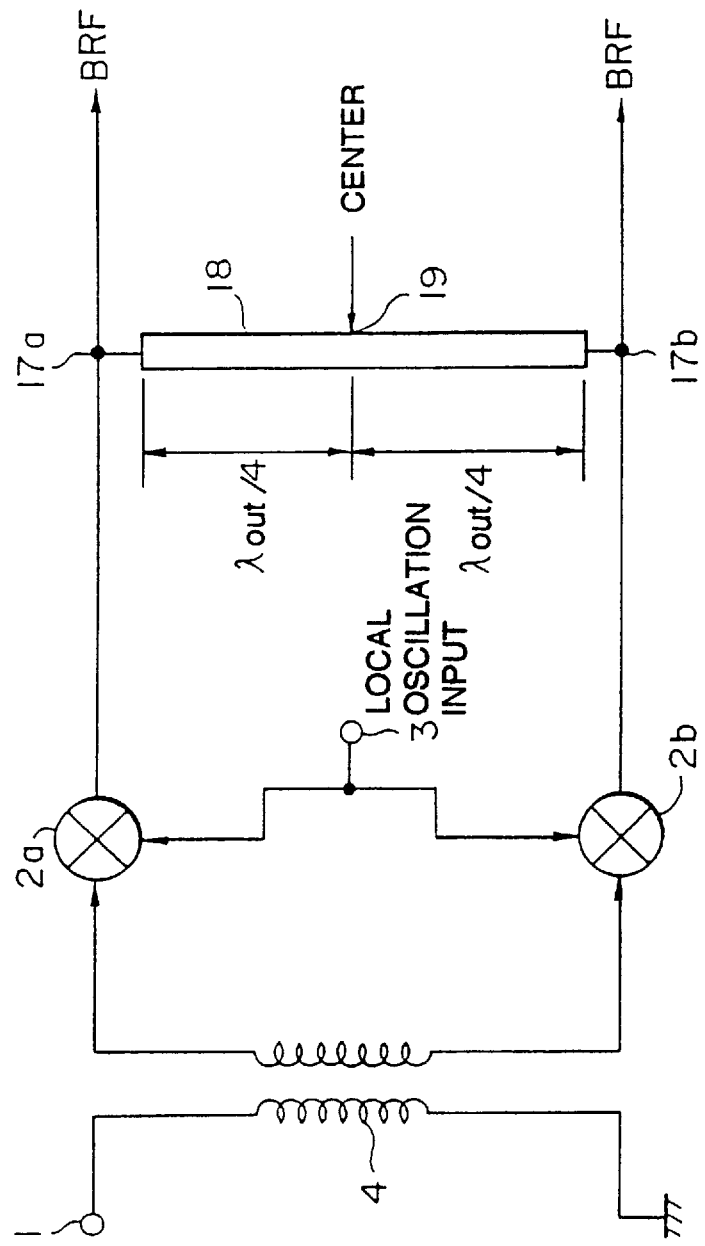
FIG. 5 is a block diagram showing a configuration of a balanced mixer in accordance with a second embodiment of the present invention.
Figure 6:
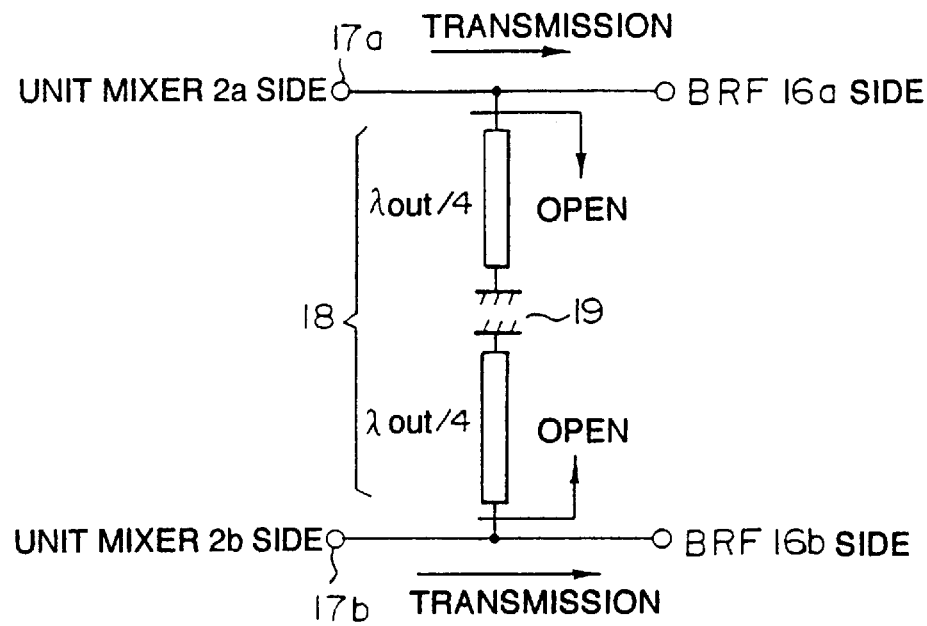
FIG. 6 depicts an equivalent circuit of the embodiment of FIG. 5, with respect to an output wave.

FIG. 5 depicts a configuration of a balanced mixer constructed in accordance with a second embodiment of the present invention. The embodiment shown in this diagram comprises a transmission line 18 having an approximately ½ wavelength at the frequency of the output wave and which is interposed between an output terminal 17a of a unit mixer FIG. 6 depicts an equivalent circuit, in particular the equivalent circuit pertaining to a mixed wave, of the transmission line 18 in this embodiment. In the case of the mixed wave, as discussed above, the impedances of the center 19 viewed from the output terminals 17a and 17b are both open circuit, and hence the presence of the transmission line 18 can be ignored with the result that the mixed waves output from the unit mixers 2a and 2b are allowed to propagate intact to the side of the BRFs 16a and 16b. In other words, with respect to the mixed wave, two line segments obtained by vertically halving the transmission line 18 at the center 19 in the diagram each act as a $\lambda \text{out}$ quarter-wave short stub.

Figure 7:
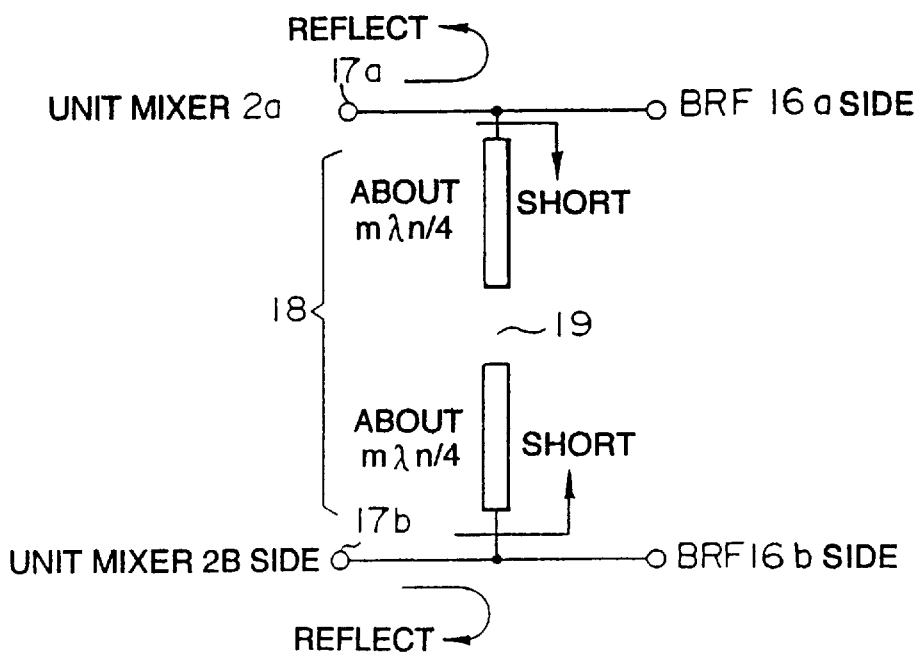
FIG. 7 depicts the equivalent circuit of the embodiment of FIG. 5, with respect to an unwanted wave with m being even.

FIG. 7 depicts a circuit electrically equivalent to the transmission line 18 in this embodiment, in particular the equivalent circuit pertaining to an unwanted wave having a frequency $|m \cdot \text{fin} \pm n \cdot \text{flo}|$ with m being even. In the case of the unwanted wave having a frequency $|m \cdot \text{fin} \pm n \cdot \text{flo}|$ with even m, as described above, the impedances of the center 19 when viewed from the output terminals 17a and 17b are effective short circuits, and hence the mixed waves output from the unit mixers 2a and 2b undergo a total reflection and are not permitted to be transmitted to the side of the BRFs 16a and 16b. In other words, for the unwanted wave having a frequency |m·fin±n·flo| with even m, two line segments obtained by vertically halving the transmission line 18 at the center 19 in the diagram, each act as an approx. m·λh quarter-wave short stub, that is, a λh quarter-wave open stub.

In this manner, the transmission line 18 serves to block the unwanted wave whose frequency is |m·fin±n·flo| with even m. Thus, this embodiment will ensure a more appropriate and selective suppression of such types of unwanted waves. It is possible to suppress, for example, such unwanted waves with even m as appear in the vicinity of a frequency fout in FIG. 25.

It will be appreciated that this embodiment also enables the concretization similar to that of the first embodiment. Further, the configurations of the 180 degree distributer and 180 degree combiner 6 are not limited to the rat-race type. The semiconductors for the frequency mixing can be FETs, diodes, or transistors. The applications are not intended to be restricted to the repeaters for Ku-band satellite communication.

(3) 3rd Embodiment

Figure 8:
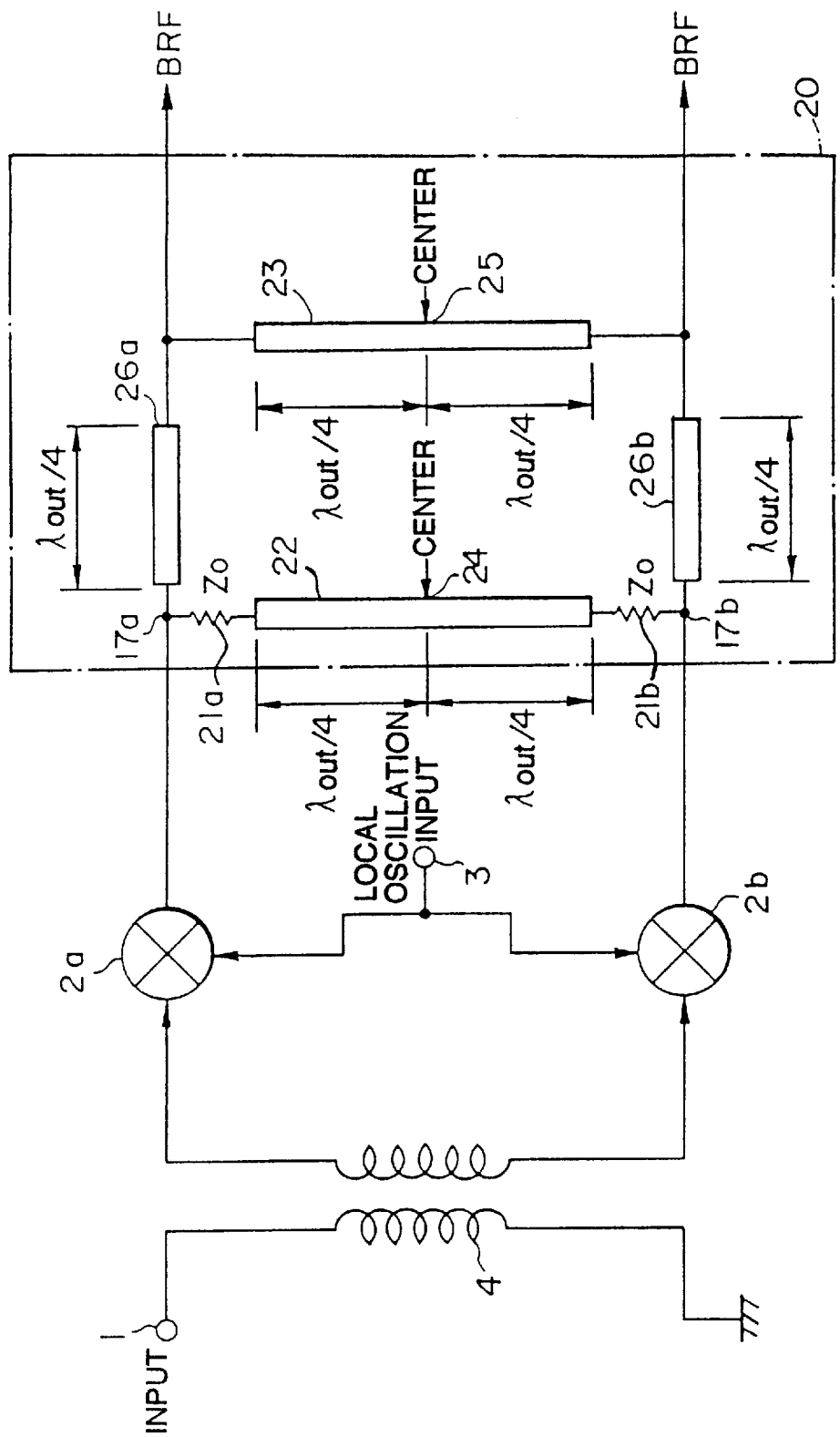
FIG. 8 is block diagram showing a configuration of a balanced mixer in accordance with a third embodiment of the present invention.

FIG. 8 depicts a configuration of a balanced mixer constructed in accordance with a third embodiment of the present invention. This embodiment comprises an unwanted wave suppression circuit 20 defined as the stage subsequent to unit mixers 2a and 2b. This diagram also has the circuit elements subsequent to BRFs 16a and 16b, as does FIG. 5.

The unwanted wave suppression circuit 20 includes four transmission lines 22, 23, 26a and 26b. The transmission line 22 which is approx. λout/2 long extends between output terminals 17a and 17b. The transmission lines 26a and 26b which are both approx. λout/4 long extend between the output terminal 17a and a BRF 16a, and between the output terminal 17b and a BRF 17b, respectively. The transmission line 23 which is approx. λout/2 extends between a far end of the line 26a on the BRF 16a side and a far end of the line 26b on the BRF 16b side. Further connected between the line 22 and the output terminal 17a, and between the line 22 and the output terminal 17b are respectively unwanted wave terminating resistors 21a and 21b having a resistance value of Z0.

In this embodiment the relationship represented in Table 4 will be established, as in the second embodiment, between mixed waves output from the unit mixers 2a and 2b, and unwanted waves having a frequency |m·fin±n·flo| with even m also output from the unit mixers 2a and 2b. Also in this embodiment, as in the second embodiment, the impedances of a center 24 of the transmission line 22 and a center of the transmission line 23 seems to be a short circuit impedance at a wavelength λout of the mixed wave, and an open circuit impedance at a wavelength λh of the unwanted wave when viewed from one end of the lines 22 and 23. Thus, the transmission lines 22 and 23 will serve as a λout quarter-wave short stub at the wavelength Xout of the mixed wave, and as an approx. λh quarter-wave open stub at the wavelength λh of the unwanted wave.

Figure 9:
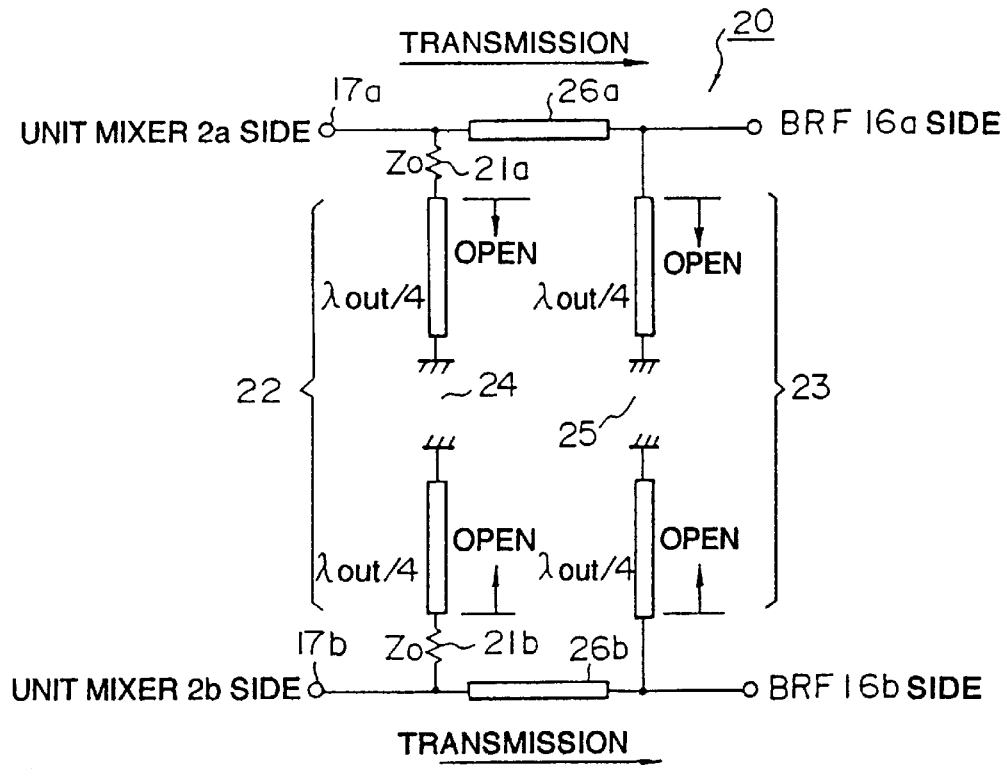
FIG. 9 is a diagram showing, for an output wave, a circuit electrically equivalent to the embodiment of FIG. 8.

FIG. 9 depicts an equivalent circuit of the unwanted wave suppression circuit 20 at a wavelength λout of the mixed wave. At this wavelength λout, in the same manner as in the second embodiment, the mixed waves which are the outputs from the unit mixers 2a and 2b are permitted to be transmitted to the side of the BRFs 16a and 16b intact, without being reflected by the transmission lines 22 and 23. Due to their equivalent length, the transmission lines 26a and 26b which intervene at that time will not cause any inconvenience.

Figure 10:
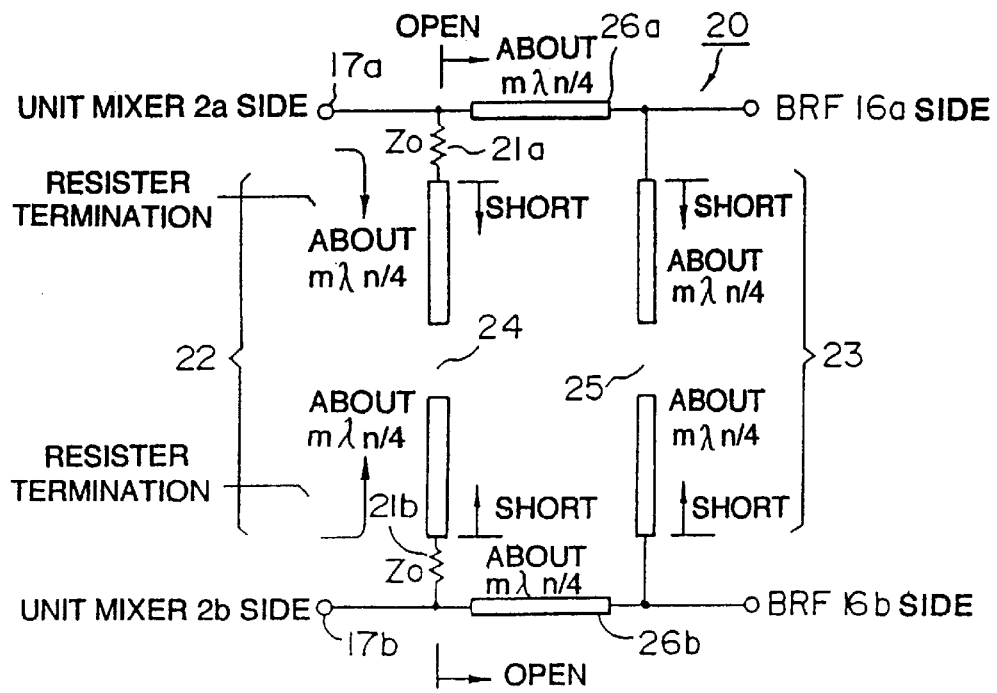
FIG. 10 is a diagram showing, for an unwanted wave with even m, a circuit electrically equivalent to the embodiment of FIG. 8.

FIG. 10 depicts a circuit electrically equivalent to the unwanted wave suppression circuit 20 at a wavelength λh of the unwanted wave. At this wavelength λh, transmission lines 22 and 23 function as a λout quarter-wave open stub. Accordingly, since a far end of a transmission line 26a on a BRF 16a side is in a short circuit state due to the presence of the line 23, the BRF 16a side when viewed through the transmission line 26a from an output terminal 17a, seems to be in an almost totally open circuit state. On the contrary, a center 24, when viewed a coupling point between a resistor 21a and the transmission line 22, seems to be in a short circuit state. Thus, the impedance when the BRF 16a side is viewed from the output terminal 17a will result in the terminating impedance Z0 of the resistor 21a. Accordingly, an unwanted wave with even m can terminate in the resistor 21a. Similarly, a far end of a transmission line 26b on a BRF 16b side is in a short circuit state due to the presence of the transmission line 23, and hence the BRF 16b side, when viewed from an output terminal 17b by way of the transmission line 26b, seems to be in an almost totally open circuit state. On the contrary, the center 24, when viewed form a coupling point between a resistor 21b and the transmission line 22, seems to be in a short circuit state. Therefore, the impedance when the BRF 16b side is viewed from the output terminal 17b will result in the terminating impedance Z0 of the resistor 21b. Thus, the unwanted wave with even m can terminate in the resistor 21b.

Thus, as in the second embodiment, this embodiment will also enable an appropriate and selective suppression of the unwanted wave having a frequency |m·fin±n·flo| with even m. Further, this unwanted wave is reflected by the unit mixers 2a and 2b in the second embodiment, whereas it terminates in the resistors 21a and 21b in this embodiment so as to ensure a more stable action of the unit mixers 2a and 2b.

This embodiment will also allow the same concretization as in the first embodiment. Furthermore, the configurations of the 180 degree distributer 4 and the 180 degree combiner 6 are not limited to the rat-race type. The semiconductors for frequency mixing can be FETs, diodes, or transistors. The applications are not intended to be restricted to the repeaters for Ku-band satellite communication.

(4) 4th Embodiment

Figure 11:
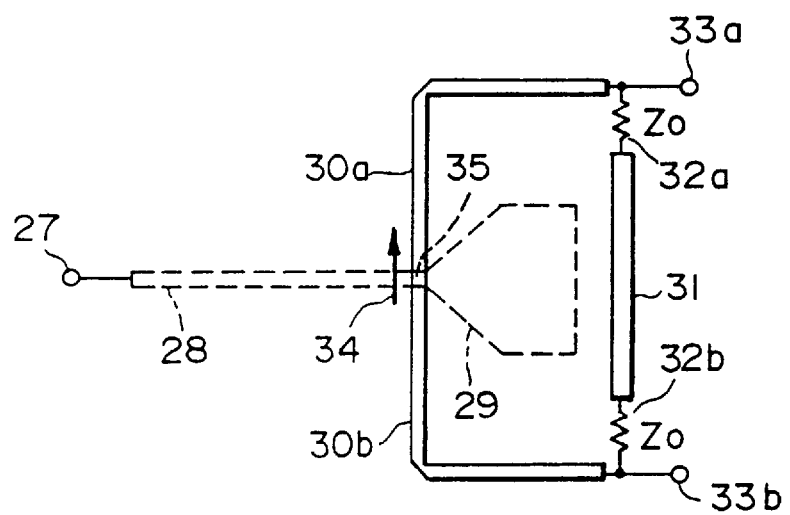
FIG. 11 is a configurative diagram of transmission lines, depicting a 180 degree distributer in accordance with a fourth embodiment of the present invention.

FIG. 11 depicts a configuration of a 180 degree distributer constructed in accordance with a fourth embodiment of the present invention. The 180 degree distributer replaces the conventional 180 degree distributer having such a configuration as shown in, e.g., FIG. 24, thereby improving a phase accuracy at the time of distribution of the input wave, and accordingly preventing the appearance of an unwanted wave having a relatively high level in the vicinity of the frequency of the output wave. The 180 degree distributer in this embodiment is applicable to the above-described conventional examples and any one of the preceding embodiments. Further, the other configurations thereof are available to the balanced mixers.

The 180 degree distributer shown, is configured to implement a transmission line 28 on the input side in the form of a slot line, and transmission lines 30a and 30b as well as a transmission line 31 acting as a stub in the form of a microstrip line. In other words, the 180 degree distributer shown is implemented by forming a conductor pattern having a shape indicated by a solid line in the diagram over one surface, of a dielectric substrate, while covering the other surface excluding the interior of a broken line in the diagram, with a conductor.

Figure 12:
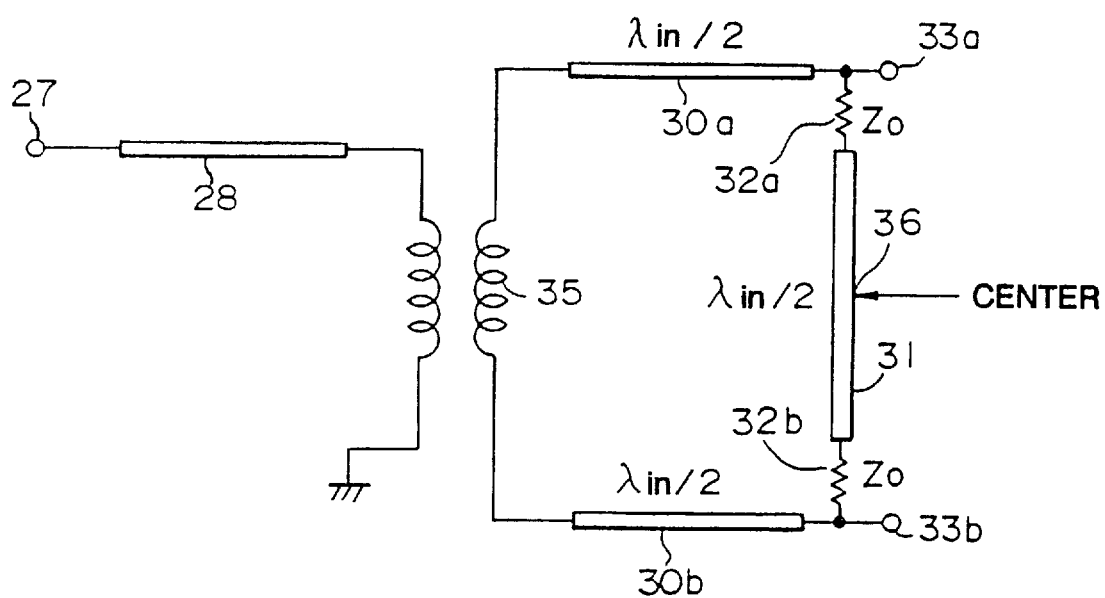
FIG. 12 is a diagram showing an equivalent circuit of the embodiment of FIG. 11, in particular, of its coupling point.

Among these transmission lines, the slot line 28 includes one end connected to an input terminal 27, and the other end 29 which functions as an open and whose width is enlarged. When a wave input through the input terminal 27 excites the slot line 28, it is allowed to travel along the slot line 28. The micro strip lines 30a and 30b have a full length of approx. λin/2 λin: input wavelength from the input terminal 27), their connection 35 lying just on the slot line 28 (at a portion where the open end 29 starts in this diagram). The slot line 28 and the microstrip lines 30a and 30b are magnetically coupled together at this connection (hereinafter referred to as a coupling point) 35. This magnetic coupling is shown as a coupling transformer (coupling point) 35 on the equivalent circuit of FIG. 12.

The microstrip lines 30a and 30b are both bent midway and arranged rightward in the diagram so as to extend in a substantially parallel relationship. Output terminals 33a and 33b are connected to respective ends of the microstrip lines 30a and 30b, that is, the points oppositely spaced apart from the coupling point 35 by the approx. λout/2 transmission 33a will result in an open circuit impedance. Further, since the line length from the output terminal 33a to the coupling point 35 is λin/2, the impedance of the coupling point 35 when viewed from the output terminal 33a seems to be a short circuit impedance with respect to ground. The same relationship applies to the output terminal 33b.

Conversely, if the output terminals 33a and 33b are excited by a wave having a wavelength of λin so as to be in-phase with each other, then the center 36 and the coupling point 35 will both be in their open circuit states. Also, since the transmission line extending from the output terminal 33a to the center 36 is λin/4 long, that section of the line acts just as a λin quarter-wave open stub with the result that the impedance, when the center 36 is viewed from the output terminal 33a, is a short circuit impedance. Moreover, the line extending from the output terminal 33a to the coupling point 35 is λin/2 long, and hence the impedance of the coupling point 35 when viewed from the output terminal 33a seems to be an open circuit impedance. The same relationship will be established for the output terminal 33b.

These relationships are summed up in Table 5 below.

TABLE 5

| PHASE DIFFERENCE AT OUTPUT TERMINALS 33a AND 33b | IMPEDANCE OF COUPLING POINT 35 | IMPEDANCE AT CENTER 36 | IMPEDANCE OF COUPLING POINT 35 OBSERBED FROM TERMINAL 33a OR 33b | IMPEDANCE OF CENTER 36 OBSERBED FROM TERMINAL 33a OR 33b |
|---|---|---|---|---|
| ○ | OPEN | OPEN | OPEN | SHORT |
| π | SHORT | SHORT | SHORT | OPEN | line. When the microstrip line 30 is excited by way of the magnetic coupling at the coupling point 35, the current flows in the direction indicated by an arrow 34 of FIG. 11 with the result that the phase of the wave at the output terminal 33a and the phase of the wave at the output terminal 33b are opposite to each other. A phase difference of π radian between the wave occurring at the output terminal 33a and the wave occurring at the terminal 33b is derived from the principle of the magnetic coupling between the slot line 28 and the micro strip line 30. This will contribute to a higher accuracy and a reduction in variation arising from the frequency, compared with the of case obtaining the phase difference by the difference in the line length as in, e.g., the rat-race type. Thus, the supply of the waves emerging from the output terminals 33a and 33b into the unit mixer 2a or 2b will result in an opposite-phase distribution having an extremely minute error ε.

In order to further improve the phase accuracy, in this embodiment, a microstrip line 31 having a full length of approx. λin/2 is provided to connect the output terminals 33a and 33b. Further, isolation resistor 32a or 32b intervene between the output terminal 33a and the microstrip line 31, and between the output terminal 33b and the micro strip line 31, respectively. These resistors 32a and 32b present a resistance value of Z0. In addition, the line lengths of the microstrip lines 30a and 30b are both dimensioned at λin/2.

If the output terminals 33a and 33b are excited to be opposite in phase with each other by the wave having a wavelength of λin in this configuration, the center 36 of the microstrip line 31 and the coupling point 35 will both lead to a shorting to ground. Since the line length from the output terminal 33a to the center 36 is λin/4, that section of the line serves just as a λin quarter-wave short stub, and the impedance when the center 36 is viewed from the output terminal In the case of an opposite-phase excitation, the impedance when the coupling point 35 is viewed from the output terminal 33a or 33b is a short circuit impedance which strengthens the magnetic coupling between the slot line 28 and the microstrip lines 30a and 30b, thus contributing to a preferable coupling of the wave with the slot line 28. Further, the impedance when the center 36 is viewed from the output terminal 33a or 33b is an open circuit impedance to allow all the waves to be transmitted to the input terminal 27 side.

Conversely, in the case of an in-phase excitation, the impedance when the coupling point 35 is viewed from the output terminal 33a or 33b is an open circuit impedance, which weakens the magnetic coupling between the slot line 28 and the microstrip lines 30a and 30b, whereby the wave is not permitted to be coupled with the slot line 28. Furthermore, the impedance when the center 36 is viewed from the output terminal 33a or 33b results in a short circuit impedance, whereby the wave is terminated by the isolation resistors 32a and 32b.

Thus, this embodiment will ensure a preferred isolation between the output terminals 33a and 33b. More specifically, among the waves input through the input terminals 27, only the wave exciting the output terminals 33a and 33b in opposite-phase is permitted to be output from the output terminals 33a and 33b, thereby further improving the phase accuracy in the opposite-phase distribution.

Figure 13:
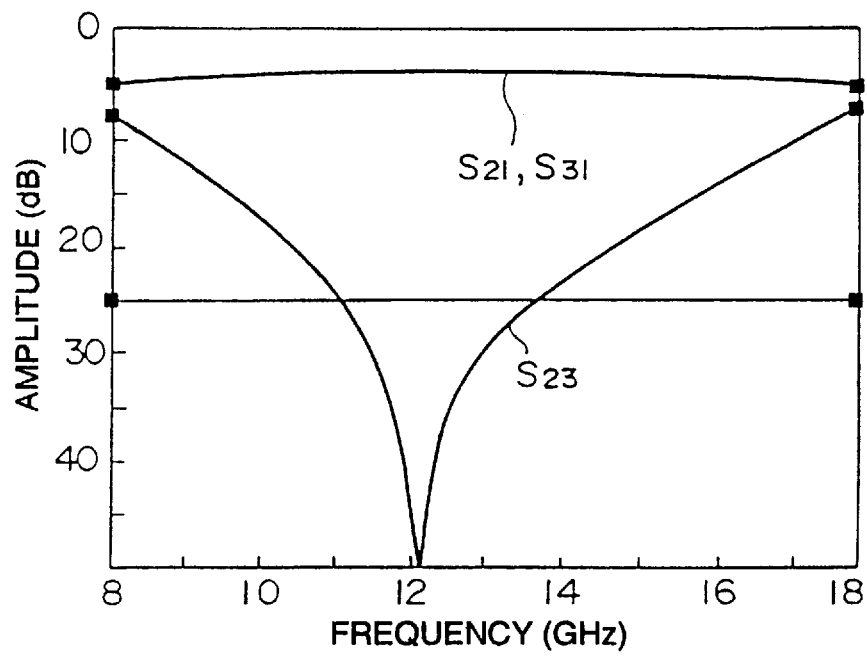
FIG. 13 is a frequency vs. amplitude attenuation value characteristic diagram, showing a design example of amplitude characteristics of the embodiment of FIG. 11.
Figure 14:
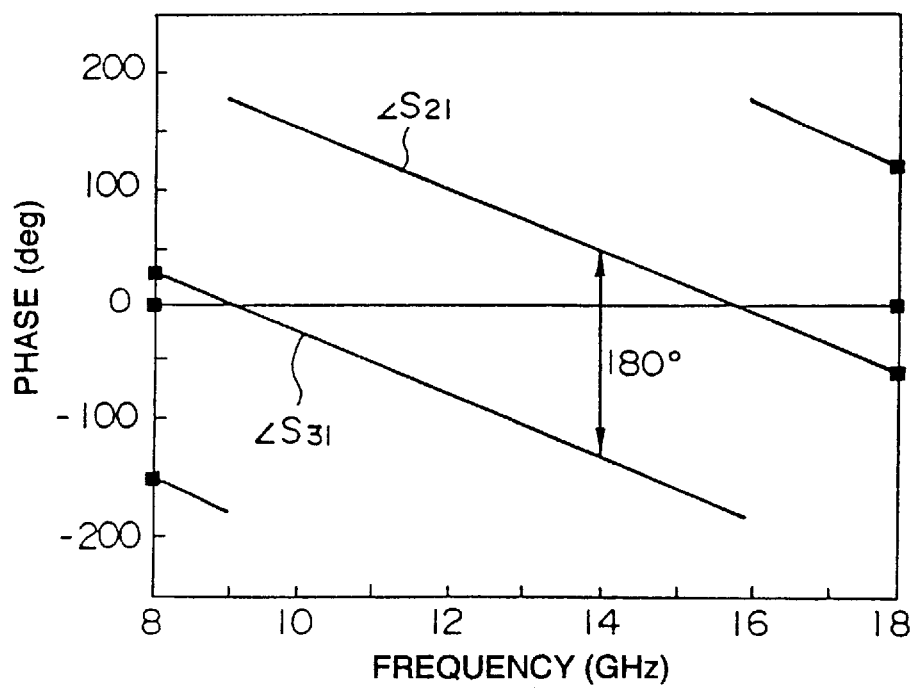
FIG. 14 is a frequency vs. phase characteristic diagram showing a design example of phase characteristics of the embodiment of FIG. 11.

FIGS. 13 and 14 depict design examples, in particular with 12 GHz band, of a 180 degree distributer constructed in accordance with this embodiment. Particularly, FIG. 13 depicts a design of amplitude characteristics, while FIG. 14 depicts a design of phase characteristics. In these diagrams, S21 represents a characteristic with the input terminal 27 for wave input and the output terminal 33a for output. Similarly, S31 represents a characteristic with the input terminal 27 for wave input and the output terminal 33b for output; and S23 represents a characteristic with the output terminal 33b for wave input and the output terminal 33a for output. The designs shown in these diagrams exhibit an amplitude attenuation value exceeding 25 dB in the vicinity of 12 GHz. A difference between the phase ∠ S21 of S21 and the phase ∠ S31 of S31 will be constantly 180 degrees (π radian).

Figure 15:
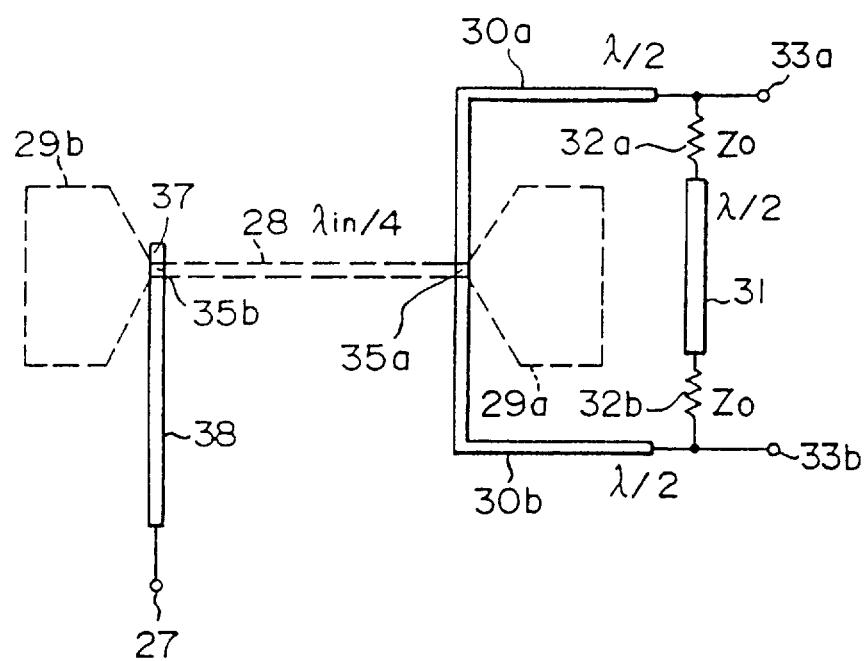
FIG. 15 is a configurative diagram of transmission lines, depicting a variant of the embodiment of FIG. 11.

FIG. 15 depicts a variant of this embodiment. In this variant, an impedance matching between an input terminal 27 and an output terminal 33a, and an impedance matching between the input terminal 27 and an output terminal 33b are implemented by virtue of, respectively, a magnetic coupling at a coupling point 35 (hereinafter referred to as 35a for identification) of a slot line 28 and microstrip lines 30a and 30b, and a magnetic coupling at a coupling point 35b of the slot line 28 and an additional microstrip line 38. A through-hole 36 is used for the connection with the rear side of a dielectric substrate. For the provision of the coupling point 35b, the slot line 29 includes not only an open end 29 (hereinafter referred to as 29a for identification) on the side of the microstrip lines 30a and 30b, but also another open end 29b separated by a space of in/4 from the open end 29a. Coupling point 35b is the start point of the open end 29b.

Figure 16:
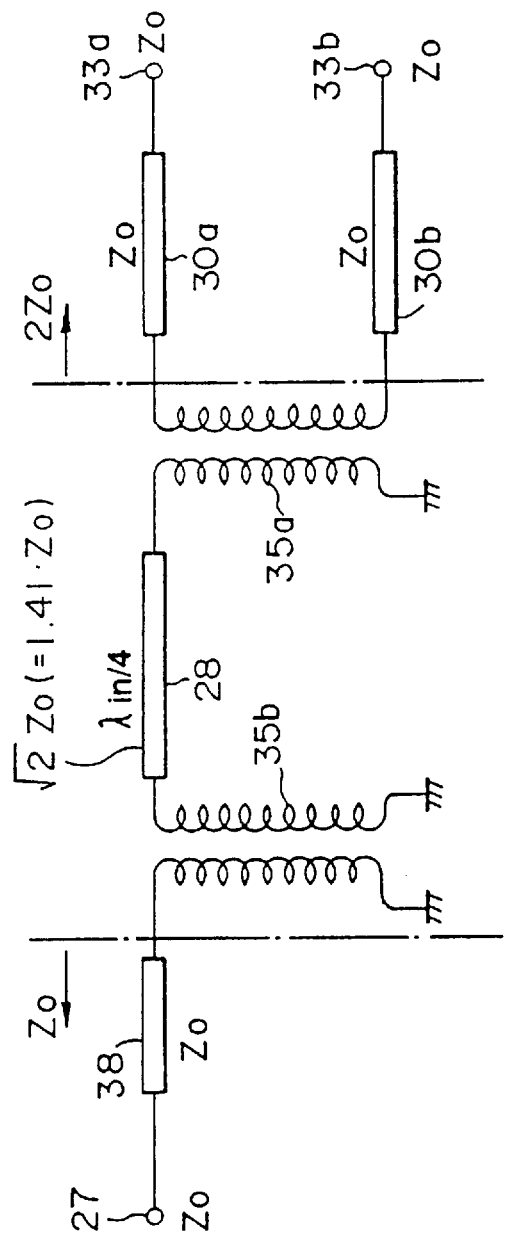
FIG. 16 illustrates an equivalent circuit of the variant of FIG. 15, in particular, the state of impedance matching.

Now, the use of a line having a characteristic impedance of Z0 as the microstrip lines 30a and 30b would result in an impedance of 2·Z0 when viewing the side of the output terminals 33a and 33b from the coupling point 35. Similarly, the use of a line having a characteristic impedance of Z0 as the microstrip line 38 would result in an impedance of Z0 when viewing the input terminal 27 from the coupling point 35b. In view of these facts, this modification has a characteristic impedance of the microstrip line 38 defined as √2·Z0=approx. 1.41·Z0. This will enable the connection of input/output terminals and the 180 degree distributer to undergo an impedance matching, as shown in FIG. 16.

(5) 5th Embodiment

Figure 17:
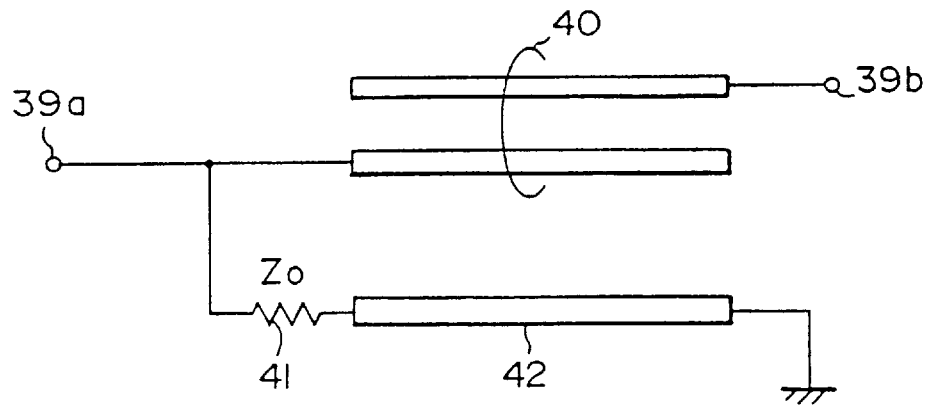
FIG. 17 depicts a configuration of transmission lines constituting a band rejection filter (BRF) in accordance with a fifth embodiment of the present invention.

FIG. 17 depicts a configuration of a BRF in accordance with a fifth embodiment of the present invention. The BRF in this embodiment can be preferably applied to BRFs 16a and 16b in the first to third embodiments.

The BRF shown comprises a coupling line 40. Among waves input through one end of such a type of coupling line, it is commonly known that the a passage of a wave having a guide wavelength four times the line length of the coupling line is allowed and that the passage of a wave having a guide wavelength twice that is blocked. With resistors 41 and 42 ignored, therefore, terminals 39a and 39b of the coupling line 40 will be open circuit within the rejection band. For this reason, the coupling line 40 can be used as a simple filter for mixers.

However, a mere application of this coupling line 40 to the BRFs 16a and 16b would inconveniently result in a reflection of waves input from unit mixers 2a and 2b into the BRFs 16a and 16b, which may cause a multiple reflection of waves between the unit mixer 2a or 2b and the BRF 16a or 16b. Such multiple reflection will impair the phase accuracy.

Thus, this embodiment, for the purpose of absorbing the reflected waves, further comprises a transmission line 42 shorted at its far end and having the same line length as that of the coupling line 40, the transmission line 42 being connected through a resistor 41 with a terminal 39a on the unit mixer 2a or 2b side.

Figure 18:
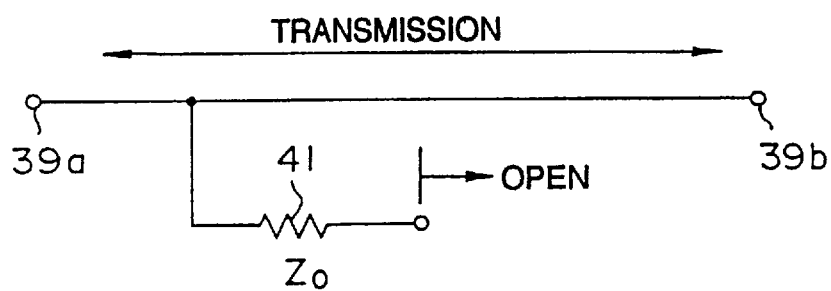
FIG. 18 is a diagram showing, with respect to a passage area of a coupling line, an equivalent circuit of the embodiment of FIG. 17.

Now, assume that input into the terminal 39a from the unit mixer 2a or 2b is a wave having a frequency at which the electric lengths of the coupling line 40 and the transmission line 42 are both equal to (2n+1)/4 wavelength (n: any integer) of the input wave. In this case, as shown in FIG. 18, the coupling line 40 presents a passage characteristic whereas the line 42 serving as a quarter-wave short stub becomes open, whereby the wave input through the terminal 39a is transmitted up to the terminal 39b for the output.

Figure 19:
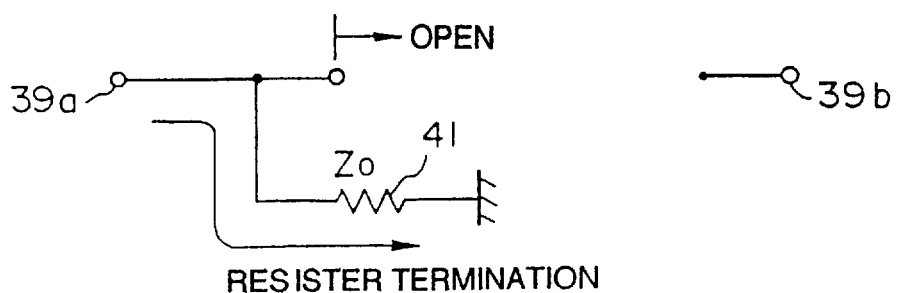
FIG. 19 is a diagram showing, with respect to a rejection band of the coupling line, an equivalent circuit of the embodiment of FIG. 17.
Figure 20:
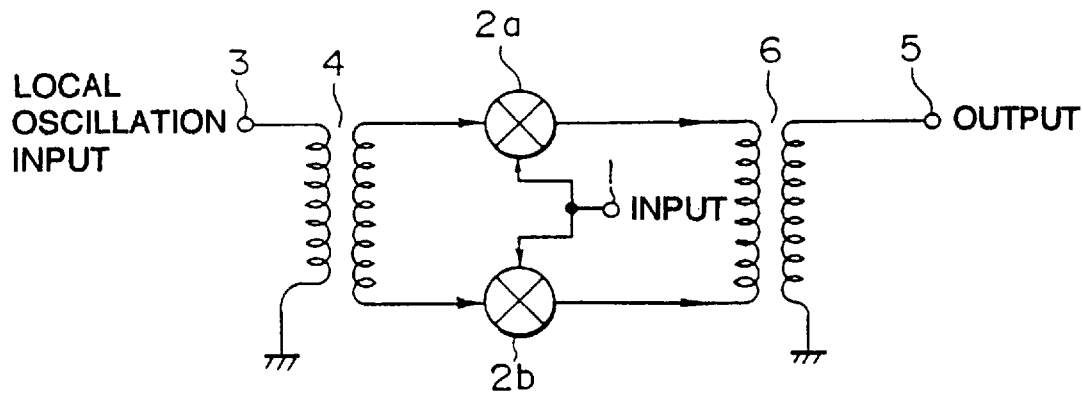
FIG. 20 is a block diagram showing a configuration of a balanced mixer in accordance with a conventional example.
Figure 21:
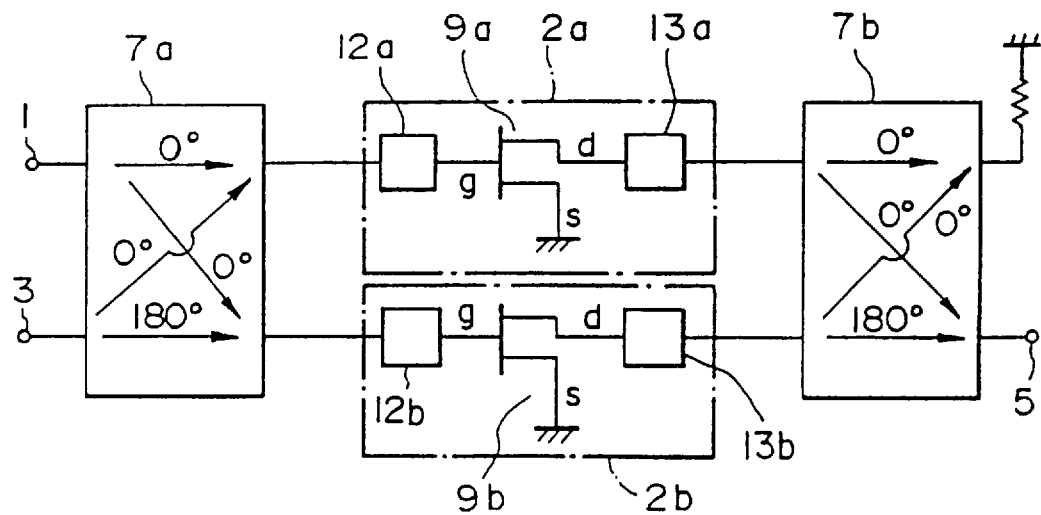
FIG. 21 is a block diagram showing a more concrete configuration of the balanced mixer of FIG. 20.
Figure 22:
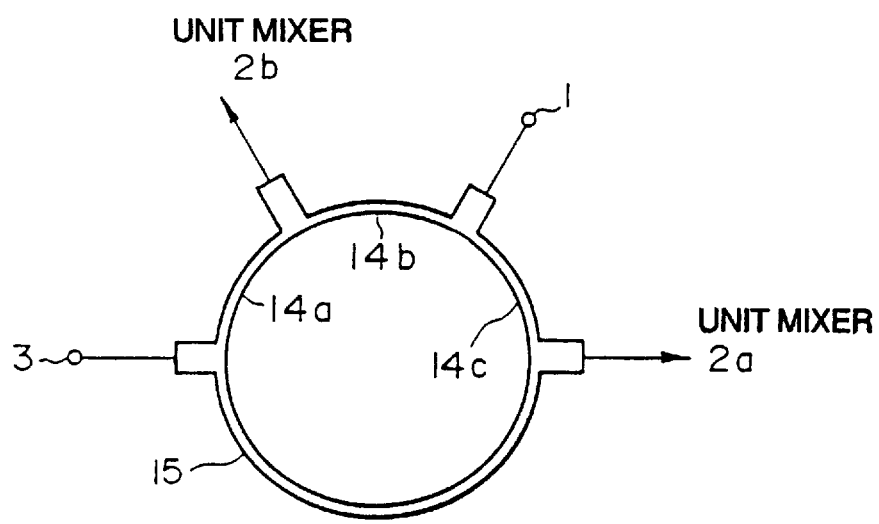
FIG. 22 is a line configuration diagram depicting a rat-race type 180 degree hybrid.

Then, assume that input into the terminal 39a from the unit mixer 2a or 2b is a wave having a frequency at which the electric lengths of the coupling line 40 and the transmission line 42 are both equal to n/2 wavelength (n: any integer). In this case, as shown in FIG. 19, the coupling line 40 results in an open circuit state to implement a rejection characteristic whereas the line 42 serving as a half-wave short stub becomes shorted, whereby the terminal 39a is terminated by the resistor 41. As a result of this, in the rejection band no reflection toward the unit mixers 2a and 2b side will cause. Thus, any multiple reflection is prevented, to accomplish an even higher phase accuracy, thereby enabling the unwanted waves to be suppressed.

INDUSTRIAL APPLICABILITY

The present invention is applicable to a mixer for the output of a wave obtained by frequency mixing a signal wave and a local oscillation wave. In the case of balanced mixers available for satellite communication or other fields, particularly preferred is an application in which the frequency of the local oscillation wave is lower than that of the signal wave, for example, an application to a balanced mixer for use in a repeater for Ku-band satellite communication.

What is claimed is:

1. A balanced mixer comprising:

a plurality of unit mixers each for frequency mixing a signal wave and a local oscillation wave having a predetermined frequency to produce a mixed wave;

distribution means for distributing a plurality of signal waves to the plurality of unit mixers, the plurality of signal waves being generated from an input signal wave having a predetermined frequency by giving respective different phases onto the input signal wave among the plurality of unit mixers;

signal wave rejection means for removing the signal wave from the mixed wave from each of the plurality of the unit mixers;

combination means for phase-shifting and then combining a plurality of mixed waves from which signal waves are removed by said signal wave rejection means, in response to said phases given by said distribution means;

wherein said plurality of unit mixers are comprised of two unit mixers having an output terminal for outputting the mixed wave, and said balanced mixer further comprises an unwanted wave suppression means interposed between output terminals of said plurality of unit mixers for suppressing unwanted waves having a frequency which lies in the vicinity of an even multiple of the frequency of the signal wave.

2. A balanced mixer according to claim 1, wherein said plurality of unit mixers is comprised of two unit mixers, and wherein a phase difference between signal waves distributively supplied to said plurality of unit mixers from said distribution means is π radian.

3. A balanced mixer according to claim 1, wherein said plurality of unit mixers each include a source-grounded field-effect transistor for frequency mixing a signal wave and a local oscillation wave, said source-grounded field-effect transistor having a gate to which the signal wave and local oscillation wave are applied and having a drain through which a mixed wave is output.

4. A balanced mixer according to claim 2, wherein
said distribution means includes means for inputting the input signal wave; and opposite-phase distribution means for generating input signal waves having respective different phases from the input signal wave to distribute the signal waves to the plurality of unit mixers;
and wherein said combination means includes means for inputting the plurality of mixed waves from said plurality of unit mixers;
opposite-phase combination means for generating an output wave from the plurality of mixed waves by combining after giving them respective phases corresponding to the phases given by said distribution means; means for inputting the local oscillation wave; and in-phase distribution means for distributing the local oscillation wave in phase among all of the plurality of unit mixers.

5. A balanced mixer according to claim 1, wherein
said plurality of unit mixers each include a semiconductor element having nonlinear characteristics which are utilized for frequency mixing of a signal wave and a local oscillation wave.

6. A balanced mixer according to claim 5, wherein
each of said plurality of unit mixers further includes:
an input matching circuit for impedance matching of the connection of said semiconductor element and said distribution means; and
an output matching circuit for impedance matching of the connection of said semiconductor element and said combination means.

7. A balanced mixer according to claim 1, wherein
said unwanted wave suppression means includes a transmission line which is interposed between said output terminals of the plurality of unit mixers and whose electrical length at the frequency of the mixed wave is equal to substantial one half wavelength.

8. A balanced mixer according to claim 1, wherein
said unwanted wave suppression means further includes:
first transmission line which is interposed between said output terminals of two unit mixers and whose electrical length at the frequency of the mixed wave is equal to substantially one half wavelength;
a couple of terminating impedances interposed between said first transmission line and said output terminals of said two unit mixers respectively;
a couple of second transmission lines which are interposed between said output terminals of said two unit mixers and said signal wave rejection means and whose electrical length at the frequency of the mixed wave is equal to substantially one quarter wavelength; and
third transmission line which is interposed between the couple of transmission lines on the side of said signal wave rejection means and whose electrical length at the frequency of the mixed wave is equal to substantially one half wavelength.

9. A balanced mixer according to claim 1, wherein
said signal wave rejection means includes a plurality of signal wave component rejection filters respectively associated with said plurality of unit mixers, each for removing the plurality of signal waves from the mixed wave from one of the plurality of unit mixers associated therewith.

10. The balanced mixer of claim 1, wherein said balanced mixer is part of a repeater for a satellite communication system.

11. A balanced mixer comprising:
a plurality of unit mixers each for frequency mixing a signal wave and a local oscillation wave having a predetermined frequency to produce a mixed wave;
distribution means for distributing a plurality of signal waves to the plurality of unit mixers, the plurality of signal waves being generated from an input signal wave having a predetermined frequency by giving respective different phases onto the input signal wave among the plurality of unit mixers;
signal wave rejection means for removing the signal wave from the mixed wave from each of the plurality of the unit mixers;
combination means for phase-shifting and then combining a plurality of mixed waves from which signal waves are removed by said signal wave rejection means, in response to said phases given by said distribution means;
wherein said plurality of unit mixers are comprised of two unit mixers, and said distribution means includes:
a first transmission line through which the input signal wave is transmitted;
a second transmission line including a first coupling portion provided at one end to couple with said first transmission line through the first coupling portion, so as to allow a transmission of the input signal wave supplied through said first coupling portion from said first transmission line; and
a third transmission line including the first coupling portion provided at one end to couple with said first transmission line through said first coupling portion, so as to allow a transmission, opposite in phase to that of said second transmission line, of the input signal wave supplied through said first coupling portion from said first transmission line;
fourth transmission line for connecting an end of said second transmission line, opposite to said one end at which said first coupling portion is provided, to an end of said third transmission line, opposite to said one end at which said first coupling portion is defined, said fourth transmission line having electrical length of substantially one half wavelength at the frequency of the input signal wave; and
a couple of terminating impedances intervening between a connection portion of said fourth transmission line and said second transmission line, and a connecting portion of said fourth transmission line and said third transmission line;
said second and third transmission lines having an electrical length, at the frequency of the input signal wave, of substantially one half wavelength.

12. A balanced mixer according to claim 11, wherein
said distribution means further includes fifth transmission line including a second coupling portion provided at its one end to couple with said first transmission line at the second coupling portion, so as to allow a supply of the input signal wave through said second coupling portion into said first transmission line,
impedance matching being established between said fifth transmission line and said first transmission line, and between said first transmission line and said second and third transmission lines, by the conversion of characteristic impedances at said first and second coupling portions.

13. A balanced mixer according to claim 11, wherein
said first transmission line is comprised of a slot line whose one end is open, and wherein
said second and third transmission lines are comprised of microstrip lines, and wherein
at said first coupling portion, said slot line is magnetically coupled with said microstrip lines.

14. A balanced mixer according to claim 12, wherein
said first transmission line is comprised of a slot line whose both ends are open, and wherein
said fifth transmission line is comprised of a microstrip line, and wherein
at said second coupling portion, said slot line is magnetically coupled with said fifth transmission.

15. The balanced mixer of claim 11, wherein said plurality of unit mixers is comprised of two unit mixers, and wherein a phase difference between signal waves distributively supplied to said plurality of unit mixers from said distribution means is $\pi$ radians.

16. The balanced mixer of claim 11, wherein said plurality of unit mixers each include a source-grounded field-effect transistor for frequency mixing a signal wave and a local oscillation wave, said source-grounded field-effect transistor having a gate to which the signal wave and local oscillation wave are applied and having a drain through which a mixed wave is output.

17. The balanced mixer of claim 11, wherein said distribution means includes:
means for inputting the input signal wave; and
opposite-phase distribution means for generating input signal waves having respective different phases from the input signal wave to distribute the signal waves to the plurality of unit mixers; and
wherein said combination means includes:
means for inputting the plurality of mixed waves from said plurality of unit mixers;
opposite-phase combination means for generating an output wave from the plurality of mixed waves by combining after giving them respective phases corresponding to the phases given by said distribution means;
means for inputting the local oscillation wave; and
in-phase distribution means for distributing the local oscillation wave in phase among all of the plurality of unit mixers.

18. The balanced mixer of claim 11, wherein said plurality of unit mixers each include a semiconductor element having nonlinear characteristics which are utilized for frequency mixing of a signal wave and a local oscillation wave.

19. The balanced mixer of claim 18, wherein each of said plurality of unit mixers further includes:
an input matching circuit for impedance matching of the connection of said semiconductor element and said distribution means; and
an output matching circuit for impedance matching of the connection of said semiconductor element and said combination means.

20. The balanced mixer of claim 11, wherein said balanced mixer is part of a repeater for a satellite communication system.

21. A balanced mixer comprising:
a plurality of unit mixers each for frequency mixing a signal wave and a local oscillation wave having a predetermined frequency to produce a mixed wave;
distribution means for distributing a plurality of signal waves to the plurality of unit mixers, the plurality of signal waves being generated from an input signal wave having a predetermined frequency by giving respective different phases onto the input signal wave among the plurality of unit mixers;
signal wave rejection means for removing the signal wave from the mixed wave from each of the plurality of the unit mixers;
combination means for phase-shifting and then combining a plurality of mixed waves from which signal waves are removed by said signal wave rejection means, in response to said phases given by said distribution means;
wherein said signal wave rejection means includes a plurality of signal wave component rejection filters respectively associated with said plurality of unit mixers, each for removing the plurality of signal waves from the mixed wave from one of the plurality of unit mixers associated therewith; and wherein said plurality of signal wave component rejection filters each include:
a coupling line whose electrical length is substantially equal to one half wavelength at the frequency of the input signal wave supplied through one of the plurality of unit mixers associated therewith;
a terminating line having an electrical length in the order of one half wavelength at the frequency of the input signal wave, said terminating line including one end connected to a unit mixer side end, of said coupling line and including an other end connected to ground; and
a terminating impedance connecting said unit mixer side end, of said coupling line and said terminating line.

22. A distributor comprising:
first transmission line through which an input signal wave is transmitted;
second transmission line including a first coupling portion provided at its one end to couple with said first transmission line through the first coupling portion, so as to allow transmission of the input signal wave supplied through said first coupling portion from said first transmission line;
third transmission line including the first coupling portion provided at its one end to couple with said first transmission line through said first coupling portion, so as to allow transmission, opposite in phase to that of second transmission line, of the input signal wave supplied through said first coupling portion from said first transmission line, and
fourth transmission line for connecting an end of said second transmission line, opposite to said one end at which said first coupling portion is provided, and an end of said third transmission line, opposite to said one end at which said first coupling portion is provided,
said distributor conferring a phase difference of $\pi$ radian on the input signal wave, to thereafter distribute the input signal waves as a couple of signal waves to a couple of unit mixers consisting a balanced mixer.

23. The distributor of claim 22, wherein the second, third and fourth transmission lines each include microstrip lines.

24. A distributer comprising:
first transmission line through which an input signal wave is transmitted;
second transmission line including a first coupling portion provided its one end to couple with said first transmission line through the first coupling portion, so as to allow transmission of the input signal wave supplied through said first coupling portion from said first transmission line;

third transmission line including the first coupling portion provided at its one end to couple with said first transmission line through said first coupling portion, so as to allow transmission, opposite in phase to that of said second transmission line, of the input signal wave supplied through said first coupling portion from said first transmission line;

fourth transmission line for connecting an end of said second transmission line, opposite to said one end at which said first coupling portion is provided, and an end of said third transmission line, opposite to said one end at which said first coupling portion is provided said fourth transmission line having an electrical length of substantially one half wavelength at the frequency of the input signal wave; and a couple of terminating impedances intervening between a connecting portion of said fourth transmission line and said second transmission line, and a connecting portion of said fourth transmission line and said third transmission line;

said second and third transmission lines having, at the frequency of a signal wave, substantially one half wavelength.

25. A signal wave component rejection filter, comprising:

a coupling line having an electrical length substantially equal to one half wavelength at the frequency of a signal wave supplied through a unit mixer associated therewith;

a terminating line having an electrical length in the order of one half wavelength at the frequency of the signal wave, said terminating line including one end connected to a unit mixer side end of said coupling line and including an other end connected to ground; and a terminating impedance connecting said mixer side end, of said coupling line and said terminating line;

said signal wave component rejection filter being provided immediately behind said associated unit mixer which executes a frequency mixing of a signal wave and a local oscillation wave, said signal wave component rejection filter terminating and removing the signal wave output through said unit mixer.

26. A frequency mixing method, comprising the steps of:

distributing a signal wave with different phases among a plurality of unit mixers;

distributing a local oscillation wave with consistently the same phase among said plurality of unit mixers;

effecting frequency mixing, by use of said plurality of unit mixers, of thus distributed signal wave and thus distributed local oscillation signal, to produce a plurality of mixed waves;

removing the signal wave from said plurality of mixed waves;

phase-shifting said plurality of mixed waves from which said signal wave is removed, in response to phases at the time of the distribution of said signal wave, to thereafter combine them for the production of an output wave; and prior to the removing of the signal wave from the plurality of mixed waves, and after producing said plurality of mixed waves, suppressing, at the output side of each of the plurality of unit mixers, an unwanted wave having a frequency which is in the vicinity of an even multiple of the frequency of the signal wave.

27. A frequency mixing method according to claim 26, wherein said unwanted wave is suppressed by the reflection of said unwanted wave at the output side of each of the plurality of unit mixers.

28. A frequency mixing method according to claim 27, wherein said unwanted wave is suppressed by the termination of said unwanted wave at the output side of each of the plurality of unit mixers.

29. A frequency mixing method, comprising the steps of:

distributing a signal wave with different phases among a plurality of unit mixers;

distributing a local oscillation wave with consistently the same phase among said plurality of unit mixers;

effecting frequency mixing, by use of said plurality of unit mixers, of thus distributed signal wave and thus distributed local oscillation signal, to produce a plurality of mixed waves;

removing the signal wave from said plurality of mixed waves;

phase-shifting said plurality of mixed waves from which said signal wave is removed, in response to phases at the time of the distribution of said signal wave, to thereafter combine them for the production of an output wave;

wherein signal waves are distributed among said plurality of unit mixers by way of magnetic coupling of a plurality of transmission lines, and terminated and removed from said plurality of mixed waves, with the aid of a transmission line and an impedance provided on unit mixer side end, of a coupling line whose rejection band covers frequencies of said signal wave.

30. A frequency mixing method according to claim 29, wherein said magnetic coupling is coupling of a slot line and a plurality of microstrip lines.

31. A frequency mixing method according to claim 30, wherein between the outputs of said plurality of microstrip lines, isolation is established at the frequencies of the signal wave.

* * * * *